United States Patent
Reid et al.

(10) Patent No.: US 12,248,415 B2
(45) Date of Patent: Mar. 11, 2025

(54) AUTOMATED DESIGN OF BEHAVIORAL-BASED DATA MOVERS FOR FIELD PROGRAMMABLE GATE ARRAYS OR OTHER LOGIC DEVICES

(71) Applicant: Raytheon Company, Waltham, MA (US)

(72) Inventors: Stephen R. Reid, Ayer, MA (US); Sandeep Dutta, Foster City, CA (US)

(73) Assignee: Raytheon Company, Arlington, VA (US)

( * ) Notice: Subject to any disclaimer, the term of this patent is extended or adjusted under 35 U.S.C. 154(b) by 584 days.

(21) Appl. No.: 17/364,481

(22) Filed: Jun. 30, 2021

(65) Prior Publication Data

US 2024/0028533 A1    Jan. 25, 2024

Related U.S. Application Data

(60) Provisional application No. 63/117,979, filed on Nov. 24, 2020, provisional application No. 63/117,988, filed on Nov. 24, 2020, provisional application No. 63/117,998, filed on Nov. 24, 2020.

(51) Int. Cl.
*G06F 13/28* (2006.01)
*G06F 9/30* (2018.01)
*G06F 30/27* (2020.01)
*G06F 30/34* (2020.01)

(52) U.S. Cl.
CPC .......... *G06F 13/28* (2013.01); *G06F 9/30145* (2013.01)

(58) Field of Classification Search
CPC .............................. G06F 13/28; G06F 9/30145

USPC ........................................................ 710/35
See application file for complete search history.

(56) References Cited

U.S. PATENT DOCUMENTS

| | | | |
|---|---|---|---|
| 5,949,799 | A | 9/1999 | Grivna et al. |
| 6,625,797 | B1 | 9/2003 | Edwards et al. |
| 7,073,158 | B2 | 7/2006 | McCubbrey |
| 7,571,216 | B1 | 8/2009 | McRae et al. |
| 8,869,121 | B2 | 10/2014 | Vorbach et al. |

(Continued)

FOREIGN PATENT DOCUMENTS

WO     2020112999 A1    6/2020

OTHER PUBLICATIONS

Non-Final Office Action dated Jul. 11, 2022 in connection with U.S. Appl. No. 17/364,565, 11 pages.

(Continued)

*Primary Examiner* — Chun Kuan Lee

(57) ABSTRACT

A method includes obtaining behavioral source code defining logic to be performed using at least one logic device and constraints identifying data movements associated with execution of the logic. The at least one logic device contains multiple components that support at least one of: internal data movements within the at least one logic device and external data movements external to the logic device as defined by the behavioral source code and the constraints. The constraints identify characteristics of at least one of: the internal data movements and the external data movements. The method also includes automatically designing one or more data movers for use within the at least one logic device, where the one or more data movers are configured to perform at least one of the internal and external data movements in accordance with the characteristics.

20 Claims, 9 Drawing Sheets

(56) References Cited

U.S. PATENT DOCUMENTS

| | | | |
|---|---|---|---|
| 8,972,958 B1* | 3/2015 | Brewer | G06F 9/30181 |
| | | | 717/135 |
| 9,098,661 B1* | 8/2015 | Biswas | G06F 3/048 |
| 9,652,570 B1 | 5/2017 | Kathail et al. | |
| 10,084,725 B2 | 9/2018 | Raponi et al. | |
| 10,949,585 B1 | 3/2021 | Winefeld | |
| 11,048,758 B1 | 6/2021 | Kim et al. | |
| 2001/0016933 A1 | 8/2001 | Chang et al. | |
| 2002/0156929 A1 | 10/2002 | Hekmatpour | |
| 2014/0096119 A1 | 4/2014 | Vasudevan et al. | |
| 2015/0058832 A1 | 2/2015 | Gonion | |
| 2017/0262567 A1 | 9/2017 | Vassiliev | |
| 2018/0268096 A1 | 9/2018 | Chuang et al. | |
| 2019/0042222 A1 | 2/2019 | Rong | |
| 2021/0056368 A1* | 2/2021 | Nudejima | G06K 15/401 |
| 2021/0081347 A1* | 3/2021 | Liao | G06F 9/5066 |

OTHER PUBLICATIONS

"AXI DataMover v5.1—LogiCORE IP Product Guide", Xilinx, Inc., Vivado Design Suite, Apr. 2017, 59 pages.

Patel, "FPGA designs with VHDL", PythonDSP, Oct. 2017, 229 pages.

Garrault et al., "HDL Coding Practices to Accelerate Design Performance", Xilinx, Inc., White Paper: Virtex-4, Spartan-3/3L, and Spartan-3E FPGAs, Jan. 2006, 22 pages.

Shi, "Rapid Prototyping of an FPGA-Based Video Processing System", Thesis, Virginia Polytechnic Institute and State University, Apr. 2016, 71 pages.

"FIFO Generator v13.1—LogiCORE IP Product Guide", Xilinx, Inc., Vivado Design Suite, Apr. 2017, 218 pages.

Russell, "Fine Tune Your Embedded FPGA System with Emulation Tools—DornerWorks", Dec. 2017, 10 pages.

Pagani, "Software support for dynamic partial reconfigurable FPGAs on heterogeneous platforms", University of Pisa, School of Engineering, 2015/2016, 98 pages.

Erusalagandi, "Leveraging Data-Mover IPs for Data Movement in Zynq-7000 AP SoC Systems", Xilinx, Inc., White Paper: Zynq-7000 AP SoC, Jan. 2015, 27 pages.

"A Guide to Vectorization with Intel® C++ Compilers", Intel Corp., 2010, 39 pages.

"Migrating Motor Controller C++ Software from a Microcontroller to a PolarFire FPGA with LegUp High-Level Synthesis—LegUp Computing Blog", Microchip Technology Inc., 2015, 16 pages.

Nabi, "Research Article—Automatic Pipelining and Vectorization of Scientific Code for FPGAs", Hindawi, International Journal of Reconfigurable Computing, 2019, 13 pages.

"How to Cross-Compile Clang/LLVM using Clang/LLVM", The LLVM Compiler Infrastructure, Documentation—User Guides, Mar. 2019, 9 pages.

"Vitis Model Composer User Guide", Xilinx, Inc., UG1483 (v2021. 1), Jun. 2021, 938 pages.

"Vivado Design Suite User Guide—High-Level Synthesis", Xilinx, Inc., UG902 (v2019.2), Jan. 2020, 589 pages.

Liang et al., "Vectorization and Parallelization of Loops in C/C++ Code", International Conference Frontiers in Education: CS and CE, 2017, 4 pages.

Wang et al., "DeepBurning: Automatic Generation of FPGA-based Learning Accelerators for the Neural Network Family", DAC 16, Jun. 2016, 6 pages.

Jiang et al., "Hardware/Software Co-Exploration of Neural Architectures", IEEE Transactions on Computer-Aided Design of Integrated Circuits and Systems, Jan. 2020, 10 pages.

"AdvMag Optimization", RIST FX10 and Nagoya University FX100, Jul. 2018, 12 pages.

Crain, "Cray Fortran 90 Optimization", CUG 1996 Fall Proceedings, Cray Research, A Silicon Graphics Company, 1996, 2 pages.

Lantz, "Vector Parallelism on Multi-Core Processors", Cornell University, Jul. 2019, 83 pages.

Ren et al., "Exploiting Vector and Multicore Parallelism for Recursive, Data- and Task-Parallel Programs", Association for Computing Machinery, Feb. 2017, 14 pages.

Yanez et al., "Simultaneous multiprocessing in a software-defined heterogeneous FPGA", Journal of Supercomputing, Apr. 2018, 18 pages.

Niu et al., "Reconfiguring Distributed Applications in FPGA Accelerated Cluster With Wireless Networking", 2011 International Conference on Field Programmable Logic and Applications (FPL), Oct. 2011, 6 pages.

Jones et al., "Dynamically Optimizing FPGA Applications by Monitoring Temperature and Workloads", VLSID 07: Proceedings of the 20th International Conference on VLSI Design, Jan. 2007, 8 pages.

Iturbe et al., "Research Article—Runtime Scheduling, Allocation, and Execution of Real-Time Hardware Tasks onto Xilinx FPGAs Subject to Fault Occurrence", International Journal of Reconfigurable Computing, 2013, 33 pages.

Ramezani, "A Prefetch-aware Scheduling for FPGA-based Multi-Task Graph Systems", Journal of Supercomputing, Jan. 2020, 12 pages.

Jing et al., Abstract of "Energy-efficient scheduling on multi-FPGA reconfigurable systems", Microprocessors and Microsystems, Aug.-Oct. 2013, 4 pages.

Perng et al., "Energy-Efficient Scheduling on Multi-Context FPGA's", 2006 IEEE International Symposium on Circuits and Systems, May 2006, 4 pages.

Chatarasi et al., "Vyasa: A High-Performance Vectorizing Compiler for Tensor Convolutions on the Xilinx AI Engine", 2020 IEEE High Performance Extreme Computing Conference (HPEC), Sep. 2020, 12 pages.

Non-Final Office Action dated Dec. 19, 2023 in connection with U.S. Appl. No. 17/364,565, 17 pages.

Final Office Action dated Oct. 4, 2023 in connection with U.S. Appl. No. 17/364,565, 12 pages.

Non-Final Office Action dated Apr. 26, 2023 in connection with U.S. Appl. No. 17/364,565, 10 pages.

Hu et al., "Semi-automatic Hardware Design using Ontologies," ICARCV 2004, 8th Control, Automation, Robotics and Vision Conference, 2004, 6 pages.

International Search Report and Written Opinion of the International Searching Authority in connection with International Patent Application No. PCT/US2021/059009 issued Feb. 4, 2022, 16 pages.

International Search Report and Written Opinion of the International Searching Authority in connection with International Patent Application No. PCT/US2021 /059018 issued Feb. 10, 2022, 15 pages.

International Search Report and Written Opinion of the International Searching Authority in connection with International Patent Application No. PCT/US2021/059013 issued Feb. 11, 2022, 13 pages.

Sharma et al., "Run-Time Mitigation of Power Budget Variations and Hardware Faults by Structural Adaptation of FPGA-Based Multi-Modal SoPC", Computers 2018, vol. 7, No. 4, Oct. 2018, 34 pages.

Eckert et al., "Operating System Concepts for Reconfigurable Computing: Review and Survey", International Journal of Reconfigurable Computing, vol. 2016, Nov. 2016, 12 pages.

Sousa et al., "Runtime Adaptation of Application Execution under Thermal and Power Constraints in Massively Parallel Processor Arrays", Proceedings of the 18th International Workshop on Software and Compilers for Embedded Systems, Jun. 2015, 4 pages.

Pellizzoni et al., "Real-Time Management of Hardware and Software Tasks for FPGA-Based Embedded Systems", IEEE Transactions on Computers, vol. 56, No. 12, Dec. 2007, 15 pages.

Kida et al., "A High Level Synthesis Approach for Application Specific DMA Controllers", 2019 International Conference on Reconfigurable Computing and FPGAs (Reconfig), IEEE, Dec. 2019, 2 pages.

Lo et al., "Model-Based Optimization of High Level Synthesis Directives", 26th International Conference on Field Programmable Logic and Applications (FPL), EPFL, Aug. 2016, 10 pages.

(56) References Cited

OTHER PUBLICATIONS

Ferretti et al., "Lattice-Traversing Design Space Exploration for High Level Synthesis", IEEE 36th International Conference on Computer Design (ICCD), Oct. 2018, 8 pages.
Singh et al., "Parallelizing High-Level Synthesis: A Code Transformational Approach to High-Level Synthesis", EDA for IC System Design, Verification, and Testing, Mar. 2006, 20 pages.
Office Action dated Nov. 28, 2024 in connection with European Patent Application No. 21823421.9, 14 pages.

* cited by examiner

AUTOMATED DESIGN OF BEHAVIORAL-BASED DATA MOVERS FOR FIELD PROGRAMMABLE GATE ARRAYS OR OTHER LOGIC DEVICES

CROSS-REFERENCE TO RELATED APPLICATIONS AND PRIORITY CLAIM

This application claims priority under 35 U.S.C. § 119(e) to U.S. Provisional Patent Application Nos. 63/117,979; 63/117,988; and 63/117,998 filed on Nov. 24, 2020, all of which are hereby incorporated by reference in their entirety.

This application is related to the following non-provisional patent applications being filed concurrently herewith:

U.S. Non-Provisional patent application Ser. No. 17/364,565, filed Jun. 30, 2021, entitled "AUTOMATED DESIGN OF FIELD PROGRAMMABLE GATE ARRAY OR OTHER LOGIC DEVICE BASED ON ARTIFICIAL INTELLIGENCE AND VECTORIZATION OF BEHAVIORAL SOURCE CODE"; and U.S. Non-Provisional patent application Ser. No. 17/364,634, filed Jun. 30, 2021, entitled "RUN-TIME SCHEDULERS FOR FIELD PROGRAMMABLE GATE ARRAYS OR OTHER LOGIC DEVICES".

Both of these non-provisional applications are hereby incorporated by reference in their entirety.

GOVERNMENT RIGHTS

This invention was made with government support under contract number FA8650-19-C-7975 awarded by the United States Air Force. The government has certain rights in the invention.

TECHNICAL FIELD

This disclosure relates generally to the design of field programmable gate arrays (FPGAs) and other logic devices. More specifically, this disclosure relates to the automated design of behavioral-based data movers for field programmable gate arrays or other logic devices.

BACKGROUND

The design of a logic device, such as a field programmable gate array (FPGA), has a direct impact on how effectively the logic device can operate. For example, data movers can be used to provide data and program instructions respectively to data and program memories of engines, cores, or other components of a logic device. If the data movers are poorly designed, the engines, cores, or other components of a logic device may have periods where applications, instructions, or other logic is not being executed due to delays in receiving the data or program instructions. This reduces throughput or otherwise negatively impacts the performance of the logic device.

SUMMARY

This disclosure provides automated design of behavioral-based data movers for field programmable gate arrays or other logic devices.

In a first embodiment, a method includes obtaining behavioral source code defining logic to be performed using at least one logic device and constraints identifying data movements associated with execution of the logic. The at least one logic device contains multiple components that support at least one of: internal data movements within the at least one logic device and external data movements external to the logic device as defined by the behavioral source code and the constraints. The constraints identify characteristics of at least one of: the internal data movements and the external data movements. The method also includes automatically designing one or more data movers for use within the at least one logic device, where the one or more data movers are configured to perform at least one of the internal and external data movements in accordance with the characteristics.

In a second embodiment, an apparatus includes at least one processor configured to obtain behavioral source code defining logic to be performed using at least one logic device and constraints identifying data movements associated with execution of the logic. The at least one logic device contains multiple components that support at least one of: internal data movements within the at least one logic device and external data movements external to the logic device as defined by the behavioral source code and the constraints. The constraints identify characteristics of at least one of: the internal data movements and the external data movements. The at least one processor is also configured to automatically design one or more data movers for use within the at least one logic device, where the one or more data movers are configured to perform at least one of the internal and external data movements in accordance with the characteristics. The at least one processor is further configured to configure the at least one logic device based on the design.

In a third embodiment, a non-transitory computer readable medium contains instructions that when executed cause at least one processor to obtain behavioral source code defining logic to be performed using at least one logic device and constraints identifying data movements associated with execution of the logic. The at least one logic device contains multiple components that support at least one of: internal data movements within the at least one logic device and external data movements external to the logic device as defined by the behavioral source code and the constraints. The constraints identify characteristics of at least one of: the internal data movements and the external data movements. The medium also contains instructions that when executed cause the at least one processor to automatically design one or more data movers for use within the at least one logic device, where the one or more data movers are configured to perform at least one of the internal and external data movements in accordance with the characteristics.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
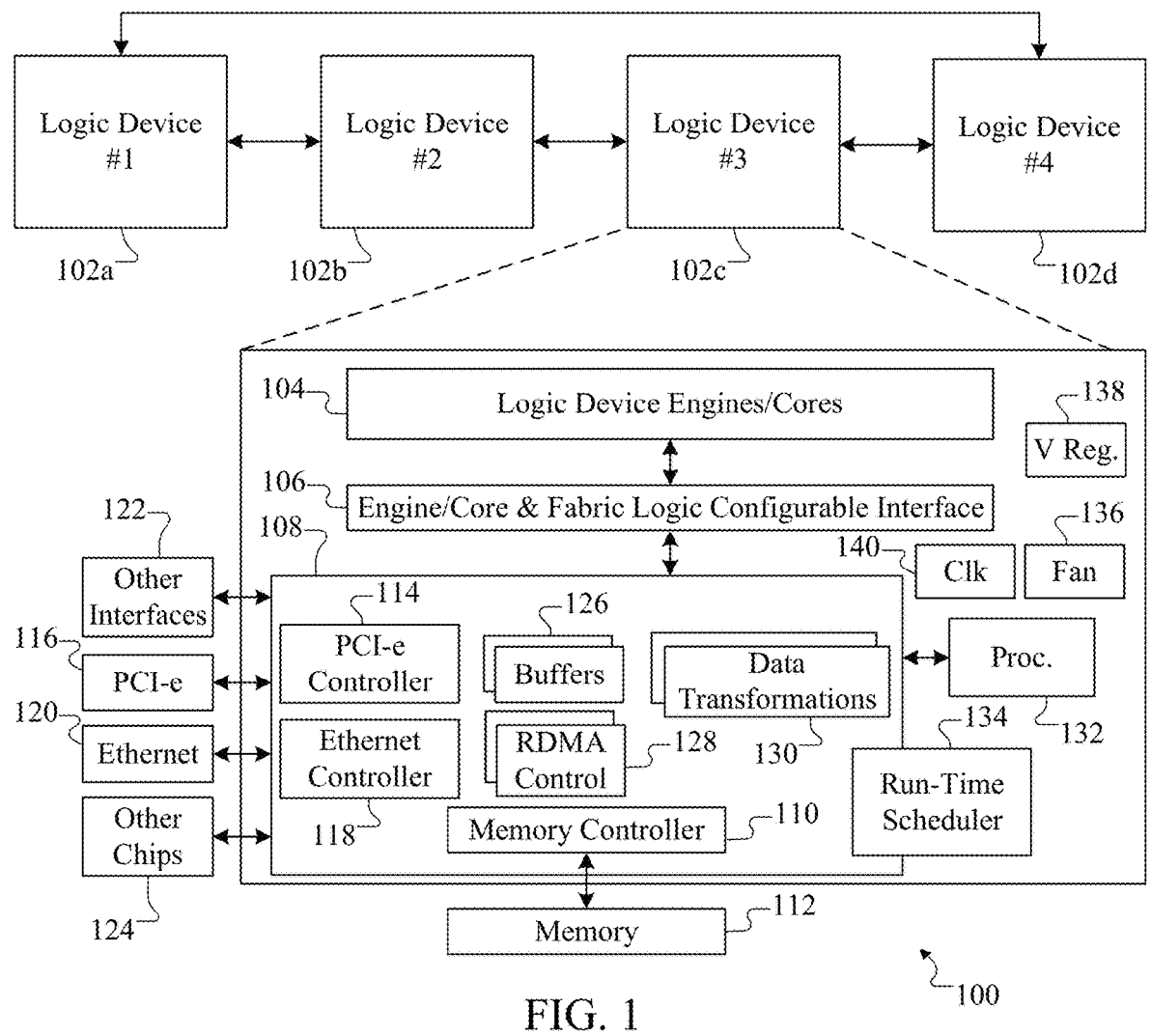
FIG. 1 illustrates an example system containing logic devices having data movers according to this disclosure.

FIGS. 1 through 8, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As described above, the design of a logic device, such as a field programmable gate array (FPGA), has a direct impact on how effectively the logic device can operate. For example, data movers can be used to provide data and program instructions respectively to data and program memories of engines, cores, or other components of a logic device. If the data movers are poorly designed, the engines, cores, or other components of a logic device may have periods where applications, instructions, or other logic is not being executed due to delays in receiving the data or program instructions. This reduces throughput or otherwise negatively impacts the performance of the logic device.

This disclosure describes an automation tool that generates at least one design for one or more data movers to be used in at least one FPGA or other logic device. As described in more detail below, the automation tool analyses at least one user constraint file or other constraints and at least one model or other information related to the hardware of at least one logic device. The automation tool uses this information to build the logic for data movements and data controls (data movers) in the at least one logic device. Among other things, the automation tool can be used to create interface logic and connections to other functional blocks in at least one logic device. For instance, the automation tool supports the ability of the designed data movers to integrate and connect with other functional blocks of the at least one logic device, such as one or more external memories, peripheral component interconnect express (PCI-e) interfaces, gigabit Ethernet interfaces, or other interfaces. Once designed, remote direct memory access (RDMA) may be used to transfer data and program instructions at specified times, such as by using a run-time intelligent scheduler as discussed in the related applications.

Various benefits or advantages may be obtained using the automation tool depending on the implementation. For example, low-level interfaces and controls for data movements have typically been designed manually, which is prone to errors and slows development times. The automation tool allows for rapid development of data movers for FPGAs or other logic devices with reduced defects, improved test times, improved cost, size, weight, and power (CSWAP) characteristics, and enhanced re-use. As particular examples, the automation tool may be used to design data movers for FPGAs or other logic devices much faster than human designers. Also, the resulting designs of the data movers can have fewer/no defects and achieve better total throughputs or other operating characteristics than manually-created designs. Additional details of example embodiments of the automation tool are provided below.

FIG. 1 illustrates an example system 100 containing logic devices 102a-102d having data movers according to this disclosure. As shown in FIG. 1, the system 100 includes four logic devices 102a-102d that are arranged in a ring configuration, meaning each logic device 102a-102d is coupled to two neighboring logic devices 102a-102d using a loop or circular set of connections. However, the number of logic devices and the arrangement of the logic devices are for illustration only. The system 100 may include any other suitable number of logic devices, possibly including a single logic device. Also, the system 100 may include any other suitable connections between logic devices (assuming multiple logic devices are present).

Each of the logic devices 102a-102d represents a programmable semiconductor chip or other integrated circuit that can be programmed to perform one or more desired functions. For example, each of the logic devices 102a-102d may represent a field programmable gate array (FPGA), an adaptive compute accelerator platform (ACAP), an application-specific integrated circuit (ASIC), a very-large-scale integration (VSLI) chip, a memory chip, a data converter, a central processing unit (CPU), an accelerator chip, or other semiconductor chip or other integrated circuit containing one or more programmable resources.

In this example, each of the logic devices 102a-102d includes a collection of logic device engines or cores 104, which represent processing circuitry or other components that can be programmed to perform one or more desired functions. For instance, the engines or cores 104 may represent programmable processing cores, programmable artificial intelligence (AI) engines, or other programmable processing circuitry. Each of the logic devices 102a-102d may include any suitable number of processing engines or cores 104. In some cases, for example, each logic device 102a-102d may include several hundred or more of the engines or cores 104. The number of engines or cores 104 may depend, among other things, on the intended application for the logic device 102a-102d, the physical size of the logic device 102a-102d, and the physical size of each engine or core 104.

An engine/core and fabric logic configurable interface 106 represents a physical interface to the various engines or cores 104 of the logic device 102a-102d. For example, the interface 106 may include a fabric or other configurable set of communication pathways that allow data, instructions, or other information to be provided from one or more sources to the engines or cores 104 and that allow data or other information to be received from the engines or cores 104 and provided to one or more destinations. The fabric or other reconfigurable communication pathways can also support communications between various ones of the engines or cores 104. The interface 106 includes any suitable structure configured to provide a physical interface with and communications to, from, and between processing engines or cores of a logic device.

Various data movement components 108 are provided in each logic device 102a-102d to support the movement of instructions and data within or through the logic device 102a-102d. This can include instruction and data transfers involving the engines or cores 104 via the interface 106. For example, the data movement components 108 may include at least one memory controller 110, which can support interactions and information exchanges involving at least one external memory 112. Each external memory 112 represents any suitable storage and retrieval device or devices, such as one or more Double Data Rate-4 (DDR4) memory devices, Low-Power Double Data Rate-4 (LPDDR4) memory devices, or other suitable memory devices. Each memory controller 110 may therefore represent a DDR memory controller, LPDDR4 memory controller, or other suitable memory controller configured to facilitate storage of information in and retrieval of information from the at least one external memory 112.

The data movement components 108 may optionally include one or more interfaces that facilitate communications over one or more external pathways. For instance, a peripheral component interconnect express (PCI-e) controller 114 may be used to support communications over a PCI-e bus 116, and an Ethernet controller 118 may be used to support communications over an Ethernet, gigabit Ethernet, ten gigabit Ethernet, or other Ethernet connection 120. Communications over one or more other suitable interfaces 122 may also be supported by the data movement components 108, and communications with other chips 124 (meaning other logic devices 102a-102d) may be supported.

The data movement components 108 may further include one or more buffers 126 (such as one or more fabric memories) that can be used to temporarily store information being transported within or through the logic device 102a-102d. Each buffer 126 may, for instance, represent a block random access memory (BRAM) or a unified random access memory (URAM). One or more RDMA controllers 128 facilitate data transfers involving the logic device 102a-102d. For example, the one or more RDMA controllers 128 may facilitate data transfers to or from the logic device 102a-102d involving one or more of the memory/memories 112, bus 116, connection 120, or other interfaces 122. The one or more RDMA controllers 128 here can also be used to provide flow control for the data transfers. Note that the ability to support data transfers using the one or more RDMA controllers 128 allows the data transfers to occur without using much if any logic device processing resources. This may also allow large numbers of data transfers to occur in parallel, which helps to achieve high throughputs. In addition, one or more data transformations 130 may be applied to data being moved within or through the logic device 102a-102d. This may allow, for example, row or column transpose operations or other operations to occur on data being transported within or through the logic device 102a-102d.

It should be noted here that buffers 126, RDMA controllers 128, and data transformations 130 represent examples of the types of data movers that may be designed using an automation tool as described below. Moreover, it should be noted here that various buffers 126, RDMA controllers 128, and data transformations 130 may be used in various ways to support desired data flows involving the logic device 102a-102d. Thus, for example, a first data flow may involve a first RDMA controller 128, a second data flow may involve a second RDMA controller 128 and a first buffer 126, and a third data flow may involve a third RDMA controller 128, a second buffer 126, and a fourth RDMA controller 128. As a result, various combinations of buffers, RDMA controllers, data transformations, and other data movement components 108 may be used in the logic devices 102a-102d. In general, the data movement components 108 may be designed or configured to support various flows of data within or through each logic device 102a-102d as needed or desired.

Each logic device 102a-102d here optionally includes at least one embedded processing device 132, which can execute various instructions to provide desired functionality in the logic device 102a-102d. For instance, the embedded processing device 132 may generate data that is provided to the engines or cores 104 or process data that is received from the engines or cores 104. The embedded processing device 132 may also interact with other logic devices 102a-102d. The embedded processing device 132 represents any suitable processing device configured to execute instructions, such as an embedded real-time (RT) processor or an embedded ARM processor or other reduced instruction set computing (RISC) processor.

Each logic device 102a-102d here includes or supports a run-time scheduler 134, which handles the scheduling of application or other logic execution by the processing engines or cores 104 and possibly other components of the logic device 102a-102d. For example, the run-time scheduler 134 may use a combination of events, operating modes, thermal information, or other information (at least some of which is not or cannot be known at compile time) to intelligently decide how best to schedule various applications or other logic to be executed by the engines or cores 104. The run-time scheduler 134 can also consider latency information and power requirements of the engines or cores 104 when determining how to schedule execution of the applications or other logic. If execution cannot be performed in a desired manner (such as when an application or other logic cannot be executed within a desired time period), the run-time scheduler 134 of one logic device 102a-102d may communicate with other logic devices 102a-102d in order to determine if the application or other logic can be suitably executed by another logic device 102a-102d.

Overall, the run-time scheduler 134 here can support a number of operations associated with execution scheduling for one or more applications or other logic. For example, the run-time scheduler 134 can support run-time application switching, meaning the applications or other logic executed by the engines or cores 104 of each logic device 102a-102d can change over time during operation of the logic devices 102a-102d. As another example, the run-time scheduler 134 can move an application or other logic executed by a first logic device 102a-102d to a second logic device 102a-102d, such as due to the current or predicted future thermal or processing load associated with the first logic device 102a-102d. As yet another example, the run-time scheduler 134 can reload instructions and application data in one or more of the engines or cores 104 while an application or other logic is running, which may support features such as extremely fast application switching. As still another example, the run-time scheduler 134 can support partial reconfiguration of one or more resources that are common to more than one application or other logic, so the run-time scheduler 134 can configure the one or more resources in advance of scheduling run-time needs. The run-time scheduler 134 interfaces with the various data movers to provide concurrent control and data movement within and between the logic devices 102a-102d.

Note that as part of its scheduling functionality, the run-time scheduler 134 can perform or initiate automatic instruction and data movements to support the dynamic execution of the applications or other logic by the engines or cores 104. In this way, the instructions and data needed for dynamic execution of applications or other logic can be provided to the engines or cores 104, such as via the interface 106 and one or more of the data movement components 108. Moreover, the run-time scheduler 134 can support inter-chip instruction and data movements if needed. This means that the run-time scheduler 134 in one logic device 102a-102d can provide instructions and data needed for execution of an application or other logic to another logic device 102a-102d, thereby allowing the other logic device 102a-102d to execute the instructions and use the data. The decision to move execution of an application or other logic can be made at run-time.

This type of functionality may find use in a number of potential applications. For example, various high-speed real-time sensor systems and other systems may typically involve the use of specialized compute accelerators. As a particular example, various radar systems may use specialized hardware components to process return signals. The engines or cores 104 of one or more logic devices 102a-102d can be used to provide the functionality of these specialized compute accelerators. Moreover, the run-time scheduler 134 can schedule the execution of one or more applications or other logic to provide the desired functionality and move the application(s) or other logic among the engines or cores 104 of one or more logic devices 102a-102d using the data movement components 108 as needed to achieve the desired processing. In some cases, this can reduce the number of logic devices and other hardware in a system. This is because one or more logic device engines or cores 104 and the logic devices 102a-102d themselves can be quickly programmed and reprogrammed as needed or desired during run-time, which helps to improve the CSWAP of the overall system.

Each logic device 102a-102d may include a number of additional components or features as needed or desired. For example, one or more fans 136 may be used for the logic device 102a-102d to cool the engines or cores 104 or other components of the logic device 102a-102d. As another example, one or more voltage regulators 138 may be used to produce operating voltages for one or more components of the logic device 102a-102d. At least one clock 140 may represent an oscillator or other source of at least one clock signal, which can be used to control the frequency, power, and resulting latency of various operations of the logic device 102a-102d.

Although FIG. 1 illustrates one example of a system 100 containing logic devices 102a-102d having data movers, various changes may be made to FIG. 1. For example, various components in FIG. 1 may be combined, further subdivided, replicated, omitted, or rearranged and additional components may be added according to particular needs. Also, FIG. 1 illustrates one example type of system in which at least one logic device may include one or more data movers designed using an automation tool. However, data movers designed using an automation tool may be used in any other suitable device or system.

Figure 2:
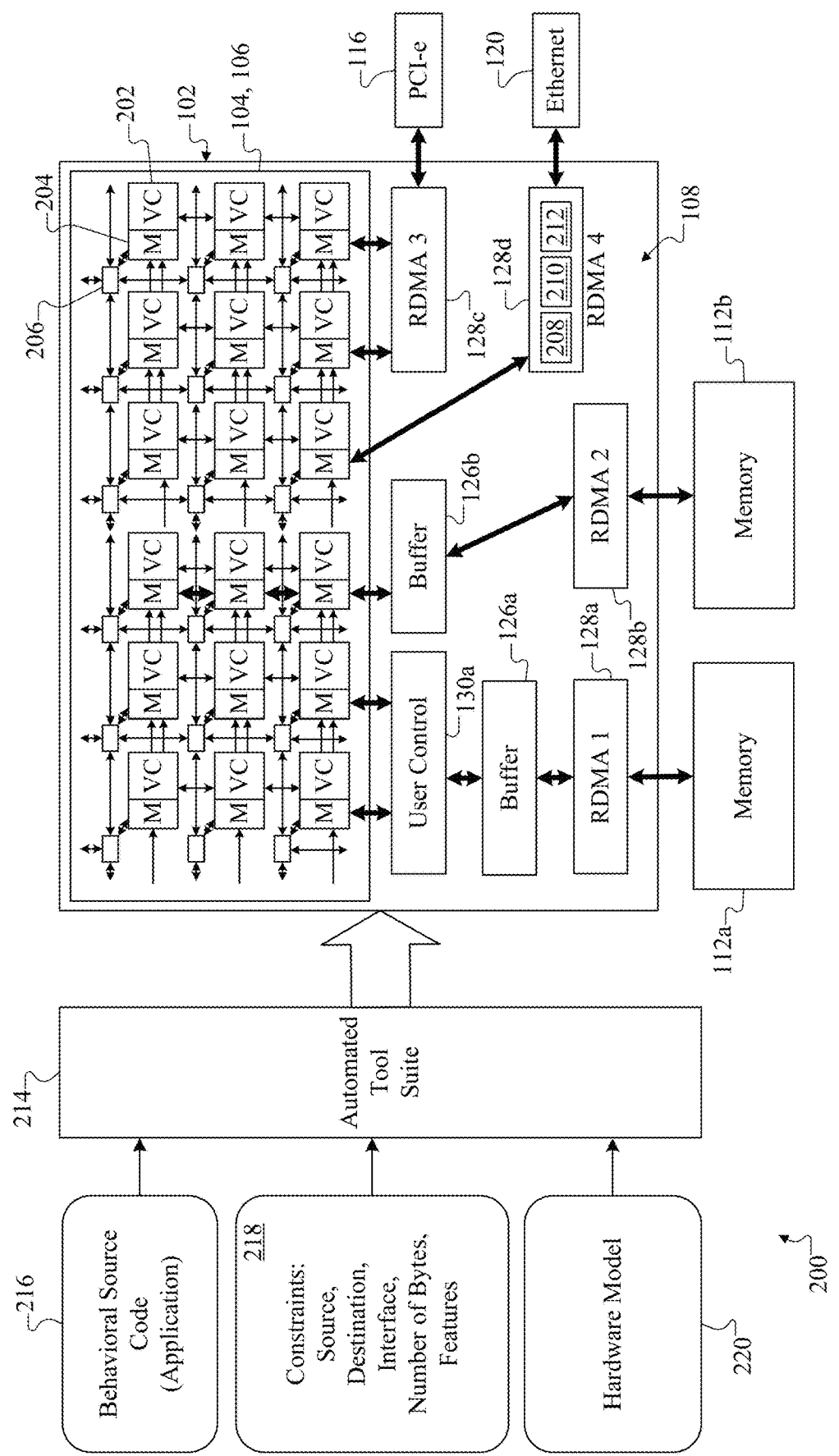
FIG. 2 illustrates an example technique for automated design of behavioral-based data movers for a logic device according to this disclosure.

FIG. 2 illustrates an example technique 200 for automated design of behavioral-based data movers for a logic device 102 according to this disclosure. The logic device 102 here may represent any of the logic devices 102a-102d shown in FIG. 1 above or other suitable logic device in any other suitable system. The logic device 102 may therefore include or be coupled to some, most, or all of the various components 104-140 shown in FIG. 1 and described above.

As shown in FIG. 2, the logic device 102 in this example embodiment includes a number of vector cores (VCs) or other processing cores 202, each of which is associated with at least one memory (M) 204 (such as an instruction memory and a data memory). Each processing core 202 and its associated memory 204 may represent at least part of one of the engines or cores 104 of the logic device 102. The logic device 102 also includes a number of programmable fabric elements 206, which may represent at least part of the engine/core and fabric logic configurable interface 106 of the logic device 102. The programmable fabric elements 206 can be configured to route information to, from, or between the processing cores 202 and their associated memories 204. Note, however, that this represents one specific example implementation of the logic device 102 and that other embodiments of the logic device 102 may be used.

In this example, the logic device 102 may communicate with one or more external memories 112a-112b (such as a DDR4 memory and a LPDDR4 memory), a PCI-e bus 116, and an Ethernet connection 120. For ease of illustration, one or more memory controllers 110, a PCI-e controller 114, and an Ethernet controller 118 have been omitted. The logic device 102 also includes a number of data movement components 108 to facilitate instruction and data movements within and through the logic device 102. In this particular example, the data movement components 108 include various buffers 126a-126b, various RDMA controllers 128a-128d, and a data transformation 130a. The data transformation 130a may have any suitable form, such as a user-defined C++ application that utilizes High-Level Synthesis (HLS) or other behavioral automation tools to create custom fabric logic. The data transformation 130a may support any of various algorithms, controls, or transformations of information, such as row or column transpose operations or other operations that rearrange or change the order of data retrieved from a buffer 126a prior to processing by at least one engine or core 104. Custom operations (such as those defined using C, C++, or other HLS logic) may also be supported by one or more data transformations 130a. As noted above, the number of each type of data mover (including the buffers 126a-126b, RDMA controllers 128a-128d, and data transformation 130a) can vary, as can the connections between those data movers.

Each RDMA controller 128a-128d may itself include various components that are selected during automated design. For example, each RDMA controller 128a-128d may include or support an RDMA memory control function 208 and a sequence random access memory (RAM) 210. The RDMA memory control function 208 can be used to fill the memory 204 or other storage(s) for one or more of the engines or cores 104. The sequence RAM 210 can identify the information to be used by the RDMA memory control function 208 to fill the memory 204 or other storage(s) for one or more of the engines or cores 104. For instance, the sequence RAM 210 may contain a list of data to be used by one or more of the engines or cores 104, such as the data's starting source address, byte count, stride, and destination address. In some cases, the stride may specify a non-incrementing address pattern. Also, in some cases, the sequence RAM 210 may contain many sequences of runtime data movements to be supported. Each RDMA controller 128a-128d may therefore be used here to support pre-fetching of data and instructions from one or more sources for one or more of the engines or cores 104 of the logic device 102. Each RDMA controller 128a-128d may or may not include an internal buffer 212 for temporarily storing information passing through the RDMA controller 128a-128d and optimizing external access performance. In some instances, each RDMA controller 128a-128d may support a bypass mode in which the memories 204 or other storages of the engines or cores 104 are used (rather than internal buffers).

In this example, an automated tool suite 214 processes various inputs in order to generate automated designs for at least some of the data movement components 108 used in the logic device 102 (and possibly other aspects of the design of the logic device 102). In this particular example, the automated tool suite 214 receives behavioral source code 216, constraints 218, and a hardware model 220 as inputs. The behavioral source code 216 generally represents an application to be automatically mapped to chip resources, such as the engines or cores 104, of the logic device 102. For example, the behavioral source code 216 may represent the functionality to be executed in order to analyze reflected signals in a radar application, analyze information from one or more sensors in an autonomous vehicle, or perform any other desired function(s). Since the logic device 102 may be used in a wide range of applications, the behavioral source code 216 to be used may vary widely based on the intended application.

The constraints 218 define permitted characteristics of internal and/or external data movements involving the logic device 102. The constraints 218 may be received from any suitable source(s), such as from one or more users. Among other things, the constraints 218 may be used to identify the logic to be executed by one or more data movers and which interface(s) may be used with each data mover. For example, the constraints 218 may identify data storage locations, data orders, amount of data per transfer, and type of data movement per transfer. As particular examples, the constraints 218 may identify a destination to which a data mover will provide information (such as data or instructions), an interface to be used by the data mover (such as an internal buffer 126, a memory controller 110, PCI-e controller 114, or Ethernet controller 118), a number of bytes or other data format to be used by the data mover to transfer the information, and any other features of the data mover.

The behavioral source code 216 and the constraints 218 may, in combination, be used by the automation tool suite 214 to map one or more applications to potentially many concurrent accelerators and RDMA data movers in order to reduce latency as specified by the constraints 218. In some cases, the data movement and accelerator latency for each application's parallelization trade can be compared by the automation tool suite 214 to seek an overall optimized mapping to target technology that provides needed latency while minimizing resources and power.

The hardware model 220 includes or represents various information about the hardware actually contained in the logic device 102 and boards or other larger structures that contain additional components and interfaces (such as the resources 112a-112b, 116, 120 and other logic devices 102). For example, the hardware model 220 may identify the numbers and types of engines or cores 104, engine/core and fabric logic configurable interface 106, and external interface(s) supported by the logic device 102. Various characteristics of the hardware in the logic device 102 can also be identified, such as the speed/latencies of the engines or cores 104, the ways in which the engine/core and fabric logic configurable interface 106 can be configured, and the bandwidths/speeds of the external interfaces.

The automation tool suite 214 may compare the performance characteristics of each hardware item and determine which interfaces should be utilized without user definition in the constraints 218. The constraints 218 also may provide serial and concurrent properties of each application such that certain bottlenecks or resource conflicts may be identified to more optimally target chip designs. For example, assume one application requires near-full bandwidth of the PCI-e bus 116 and, at the same concurrent time, another application requires more bandwidth than can fit on that same PCI-e bus 116. In this case, the automation tool suite 124 has the needed information to map the second application to another interface, such as a direct chip-to-chip gigabit serial interface.

The automated tool suite 214 generally operates to identify efficient data movement logic that can be implemented using various data movers of the logic device 102. For example, the automated tool suite 214 may identify the type(s) of data mover(s) to be used for each of one or more transfers of information needed during execution of the behavioral source code 216 using the constraints 218 and the hardware model 220. As a result, the identified types of data movers can be both (i) consistent with the constraints 218 placed on the automated tool suite 214 and (ii) satisfiable using the actual hardware of the logic device 102 as defined by the hardware model 220.

In some embodiments, the automated tool suite 214 includes a sequence memory compiler that supports the use of a higher-level RDMA language. The automated tool suite 214 can therefore automatically generate logic for one or more RDMA controllers 128 using the higher-level RDMA language and then compile the logic into code suitable for storage in and execution by the logic device 102. Also, in some embodiments, the automated tool suite 214 can assign multiple address ranges for use with each engine or core 104 to be used to execute the behavioral source code 216. The multiple address ranges may include input steering vectors and input adaptive weights (which may be used by engines or cores 104 supporting execution of machine learning algorithms) and an address range for outputting data. In particular embodiments, the code executed by the engines or cores 104 may be parallelized onto many accelerators and "vectorized" within each accelerator, and each RDMA controller 128 can be optimized to support its use with the parallelized mapping and vectorized code (such as by grouping data used by multiple operations of the vectorized code).

As noted above, the automated tool suite 214 uses the behavioral source code 216 as one input when determining the design(s) of the data mover(s) for the logic device 102. In some embodiments, the automated tool suite 214 uses the behavioral source code 216 by parsing the behavioral source code 216 in order to identify data that is used by the behavioral source code 216 during execution, where that data is retrieved from at least one internal source (within the logic device 102) or external source (outside the logic device 102) during execution of the behavioral source code 216. The automated tool suite 214 also uses the behavioral source code 216 by parsing the behavioral source code 216 in order to identify data that is to be output from the engine(s) or core(s) 104 that execute the behavioral source code 216, such as by identifying the results of the processing to be provided to at least one internal destination (within the logic device 102) or external destination (outside the logic device 102). The source(s) of the data to be processed by the behavioral source code 216 and the destination(s) for the results produced by the behavioral source code 216 may be defined within the behavioral source code 216 itself, such as when the behavioral source code 216 identifies specific inputs to be received by the behavioral source code 216 and specific outputs to be produced by the behavioral source code 216. This allows the automated tool suite 214 to use the behavioral source code 216 in order to identify the types of data movements to be needed by the behavioral source code 216 during execution.

Also, as noted above, the automated tool suite 214 uses the constraints 218 as another input when determining the design(s) of the data mover(s) for the logic device 102. In some embodiments, the automated tool suite 214 uses the constraints 218 by parsing the constraints 218 in order to identify various limitations placed on the automated design for the logic device 102 (including on the automated design of the data movers). In some cases, the constraints 218 may include a maximum latency allowed for each application of the logic device 102 or one or more of its components, maximum resources allowed for use by the logic device 102 during use, a maximum power allowed for the logic device 102 or one or more of its components, and a maximum temperature allowed for the logic device 102 or one or more of its components. The constraints 218 may also include timing closure or other clock frequency information, an order of applications to be executed (such as sequentially or concurrently), and run-time priorities of the applications. The constraints 218 may further include internal and external interfaces (and optionally their associated latencies) to be used for data movements, internal and external data organization and movement information (such as DDR4 data addressing), and run-time application switching information (such as whether each application is load on demand or run on demand). Here, "load on demand" may be used to indicate that at least part of an application is not loaded until instructed, and "run on demand" may be used to indicate that at least part of an application is not executed until instructed (but can be pre-loaded).

The following provides one specific example of the type of constraints 218 that may be defined for a given logic device 102. Here, example constraints 218 are being used to define how a DDR4 external memory 112 may be used.

one or more data movers. This may also allow the automated tool suite 214 to include suitable driver(s) or other information in the logic device 102.

In some embodiments, the automated tool suite 214 may generate a design for one or more data movers as follows. The automated tool suite 214 can parse the behavioral source code 216 to identify which data needs to be retrieved for input and which data needs to be output during execution of the behavioral source code 216. The automated tool suite 214 can parse the constraints 218 and hardware model 220 and use the information to identify the data movement logic that is to be used with one or more data movers. Among other things, the data movement logic can be defined in order to automatically prefetch data prior to a required start time and optionally buffer information needed by one or more engines or cores 104. A stride of the prefetch and buffering may, in some instances, be based on sequences of prior data accesses. The data movement logic can also define RDMA-based data movements needed in order to reduce or avoid cache misses during execution of the behavioral source code 216 (where the RDMA-based data movements can be used to define sequence memories in the RDMA controllers 128a-128d). The automated tool suite 214 can further define synchronization, timing, and flow control specifications for the defined data mover(s), such as to support transfers of data between different resources connected to each RDMA controller 128a-128d. If more complex data movements are needed than achievable using a single RDMA controller, the automated tool suite 214 can

```
memory_def : name = fabric_ddr4, interface {NOC_port1, size=2G};
// Size=2G means 2G address space in DDR4 using lower defined constraints for
// offset shown in application_def.
// Priority of multiple interfaces requesting DDR4 is based on channel 0 having
// highest priority, but being extended for user priority defined.
kernel_def : name = aximm_to_aie, interfaces = {in [memory, direction=input],out
    [streaming, array=7, direction=output,port_name=M[%02d]_AXIS]};
kernel_def : name = aie_to_aximm, interfaces = {in [streaming, array=1,
    direction=input,port_name=S[%02d]_AXIS], out [memory, direction=input]};
kernel_def : name = rdma_to_aie , interfaces = {aie_master [memory,
    direction=output ],mem_master [memory, direction=output ],
    program_mem [local_memory,direction=input,size=8092],control [control,
    direction=input]};
kernel_def : name = aie_to_rdma , interfaces = {aie_master [memory,
    direction=output ],mem_master [memory, direction=output ],
    program_mem [local_memory,size=8092],control [control, direction=input]};
application_def : name = compute_kernel,
    kernels = {compute_kernelF, compute_kernel[5], compute_kernelL,
        aximm_to_aie, aie_to_aximm, rdma_to_aie, aie_to_rdma },
    connections = {// connect rdma_to_aie
      // memory master goes to fabric_ddr4
      rdma_to_aie.mem_master -> [fabric_ddr4,offset=0x100000000],
      // aie master goes mm2s of aximm_to_aie
      rdma_to_aie.aie_master -> aximm_to_aie.in;
      // connect aie_to_rdma
      // memory master goes to fabric_ddr4
      rdma_to_aie.mem_master -> [fabric_ddr4,offset=0x200000000],
      // aie master goes mm2s of aie_to_aximm
      aie_to_rdma.aie_master -> aie_to_aximm.out;
```

In addition, as noted above, the automated tool suite 214 uses the hardware model 220 as yet another input when determining the design(s) of the data mover(s) for the logic device 102. In some embodiments, the automated tool suite 214 uses the hardware model 220 by parsing the hardware model 220 in order to identify the actual available hardware resources, including the logic device(s) 102, and associated performance characteristics. This allows the automated tool suite 214 to identify what hardware is available for use and determine how that hardware may be used with or to support support the design and chaining of multiple RDMA controllers in a serial sequence, as well as the definition of synchronization, timing, and flow control specifications between the RDMA controllers.

The design of the RDMA controllers involved with external interfaces (such as to the memories 112a-112b, bus 116, or connection 120) can be based on the estimated need for buffering and controlling the transfer of information via those interfaces. Data changes (such as transpose or pre-calculation operations) may be identified based on the needs of the behavioral source code 216 and how data is stored externally or received via the external interfaces, and buffering may be provided before and/or after each data change. Data re-ordering can also be designed automatically to reduce latency, such as by matching the order in which data is processed by accelerators to the order of the data after the re-ordering. Any desired data manipulations, such as fixed-point to floating-point conversions, application of conditionals, and pre-calculations, may be supported using data transformations 130 generated based on the behavioral source code 216. Timing control (such as waiting for data memory availability in an engine or core 104) and flow control can be defined to support interactions with external sources of data. If necessary, any drivers and other operating system (OS) components may be inserted and compiled for use by the logic device 102, such as to support the use of the memories 112a-112b, bus 116, or connection 120. In addition, any desired connections between control logic and physical resources can be defined, such as interfaces between the controllers 110, 114, 118 and the various resources 112a-112b, 116, 120 of the logic device 102.

Once the data movers are defined and compiled as necessary, the data movers can be provided from the automated tool suite 214 to the logic device 102 for use. Note that the data movers may be provided to any number of logic devices 102, such as when a large number of logic devices 102 are being customized for use in a specific product of one or more applications.

Although FIG. 2 illustrates one example of a technique 200 for automated design of behavioral-based data movers for a logic device 102, various changes may be made to FIG. 2. For example, the behavioral-based data movers may be used to support data movements involving other components of the logic device 102, such as the embedded processing device 132. Also, the behavioral-based data movers may be designed based on any other suitable inputs, and the behavioral-based data movers may be designed for use in any other suitable logic devices.

FIGS. 3A through 3E illustrate example types of data movers 300a-300e that may be automatically designed for a logic device according to this disclosure. For ease of explanation, the data movers 300a-300e are described as being used with the logic device 102 of FIG. 2, which may represent any of the logic devices 102a-102d in the system 100 of FIG. 1. However, the data movers 300a-300e may be used with any other suitable logic devices and in any other suitable system.

Figure 3A:
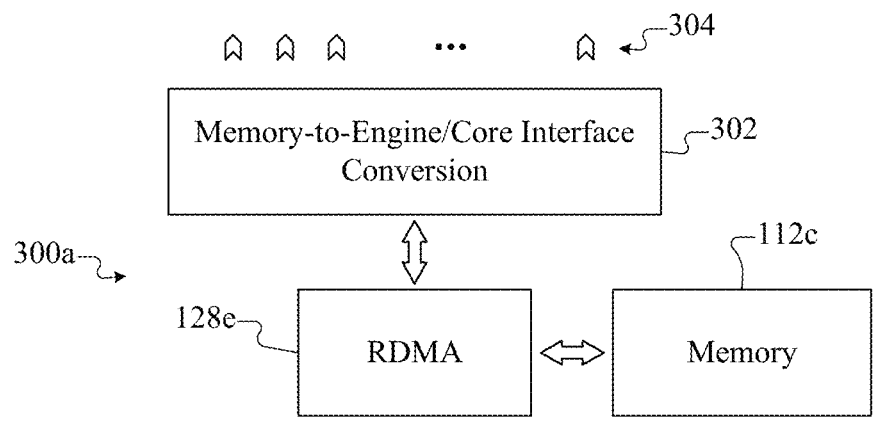
FIGS. 3A through 3E illustrate example types of data movers that may be automatically designed for a logic device according to this disclosure.

In FIG. 3A, the data mover 300a is defined using an RDMA controller 128e that supports transfers of information from an external memory 112c to one or more (accelerator) engines or cores 104 via a memory-to-engine/core interface conversion function 302. A similar operation may involve a buffer 126 in place of the external memory 112c. The conversion function 302 generally operates to convert between the protocols used by the interfaces of the external memory 112c and the engines or cores 104. As a particular example, the conversion function 302 may convert between an Advanced eXtensible Interface (AXI) used by an external memory 112c and AIE interfaces used by XILINX engines or cores 104. Note, however, that other conversions may be used if other types of interfaces are present in a logic device 102. Also note that while the conversion function 302 is shown here as residing outside the RDMA controller 128e, the conversion function 302 may be performed by the RDMA controller 128e.

In this example, the conversion function 302 supports communications over multiple channels 304 to multiple engines or cores 104 of the logic device 102. In some cases, the conversion function 302 may allow for communications with up to sixty-four engines or cores 104, although other numbers of channels 304 may be supported. The RDMA controller 128e or the conversion function 302 may be configured to include a buffer, such as a buffer of up to 2,048 entries, for each channel 304. In particular embodiments, the conversion function 302 may include one memory-mapped slave interface, and this interface can be used by the RDMA controller 128e to write data to the engines or cores 104 (such as via streaming). The conversion function 302 may be configured to send data to one or more of the engines or cores 104 simultaneously, and an address map of the engines or cores 104 may be run-time configurable (so interfaces with the engines or cores 104 can be programmed as required by each application). The syntax used by the RDMA controller 128e or the conversion function 302 may vary based on, among other things, the specific engines or cores 104 being used in the logic device 102.

In particular embodiments, each channel 304 from the conversion function 302 may be assigned an address range, and the default values for the address ranges might be something like 0x10000 to 0x11fff (Channel 0), 0x20000 to 0x21ffff (Channel 2), and so on. The RDMA controller 128e may maintain a copy of the channel number-to-address range mappings so that, when a channel number is specified for writing data to a specific engine or core 104 over a specific channel 304, the RDMA controller 128e can look up the address range mapping corresponding to the channel number and write to the appropriate address location. Note that the address ranges may be programmable and that two or more channels 304 may share the same address range. If an address range is shared by multiple channels 304, a write to any of these channels 304 may result in a broadcast to all of the channels 304 that share the same address range.

Figure 3B:
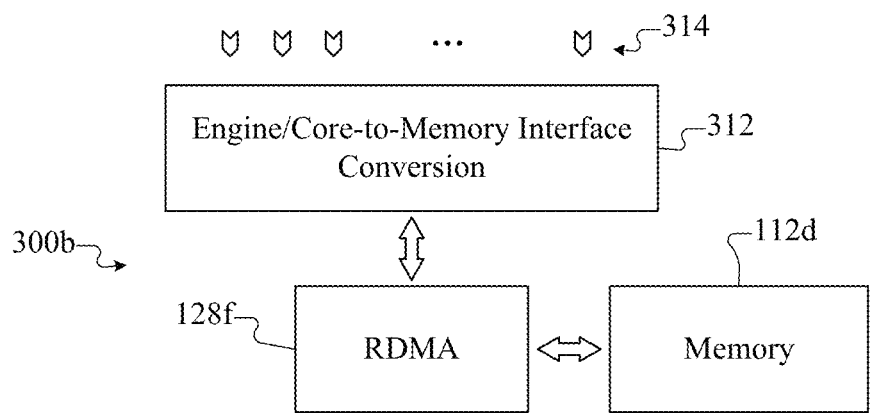

In FIG. 3B, the data mover 300b is defined using an RDMA controller 128f that supports transfers of information to an external memory 112d from one or more engines or cores 104 via an engine/core-to-memory interface conversion function 312. A similar operation may involve a buffer 126 in place of the external memory 112d. Again, the conversion function 312 generally operates to convert between the protocols used by the interfaces of the external memory 112d and the engines or cores 104, such as by converting between an AXI interface used by the external memory 112d and AIE interfaces used by XILINX engines or cores 104. Note, however, that other conversions may be used if other types of interfaces are present in a logic device 102. Also note that while the conversion function 312 is shown here as residing outside the RDMA controller 128f, the conversion function 312 may be performed by the RDMA controller 128f.

In this example, the conversion function 312 supports communications over multiple channels 314 from multiple engines or cores 104 of the logic device 102. In some cases, the conversion function 312 may allow for communications with up to sixty-four engines or cores 104, although other numbers of channels 314 may be supported. The RDMA controller 128f or the conversion function 312 may be configured to include a buffer, such as a buffer of up to 2,048 entries, for each channel 314. In particular embodiments, the conversion function 312 may include one memory-mapped slave interface, and this interface can be used by the RDMA controller 128f to read data from the engines or cores 104 (such as via streaming). The engines or cores 104 can be memory-mapped dynamically during run-time, such as via a register interface. The syntax used by the RDMA controller 128*f* or the conversion function 312 may vary based on, among other things, the specific engines or cores 104 being used in the logic device 102.

Figure 3C:
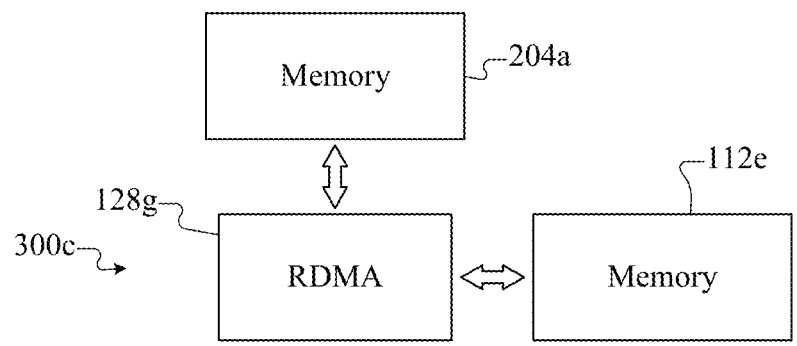

In FIG. 3C, the data mover 300*c* is defined using an RDMA controller 128*g* that supports transfers of information between two memories, such as a fabric buffer memory 204*a* and an external memory 112*e*. A similar operation may involve buffer-to-buffer or external memory-to-external memory transfers. Here, the RDMA controller 128*g* may support the use of two master interfaces to read/write data between memory locations in different memories. A memory program statement can specify a source address, a source memory master, a byte count, optional strides, and a destination address.

Figure 3D:
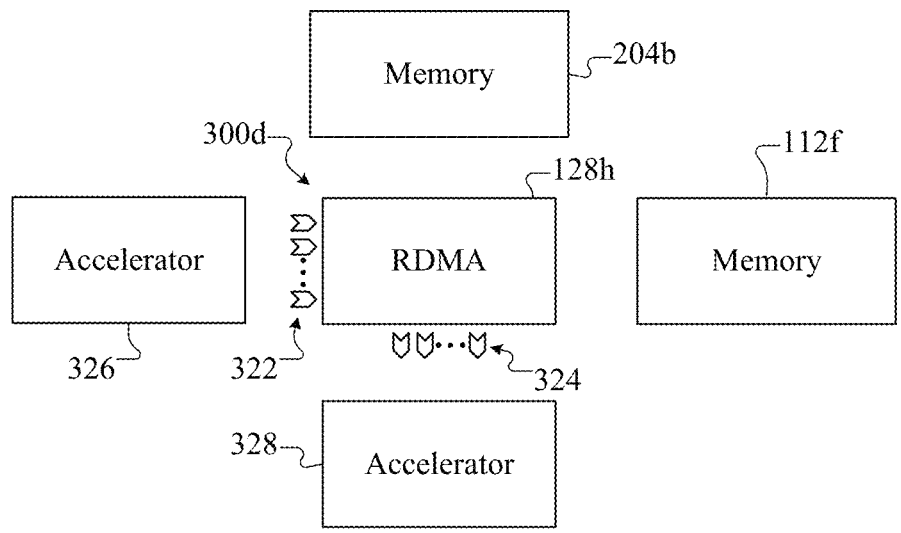

In FIG. 3D, the data mover 300*d* is defined using an RDMA controller 128*h* that supports streaming transfers of information to or from other chip resources. Here, the RDMA controller 128*h* may support a number of input channels 322 (such as four input channels) and a number of output channels 324 (such as four output channels). The input channels 322 may be used to receive information being streamed from a chip resource, and the output channels 324 may be used to transfer information being streamed out to a chip resource. Accelerators 326 and 328 (such as FPGA fabric logic) may optionally be used to perform logic functionality (acceleration) and stream into the RDMA controller 128*h*, which can move data into the memory 204*b* or 112*f*. Note that, in some cases, one or both memories 204*b* or 112*f* here may represent any of the memories 204 of the engines or cores 104.

Figure 3E:
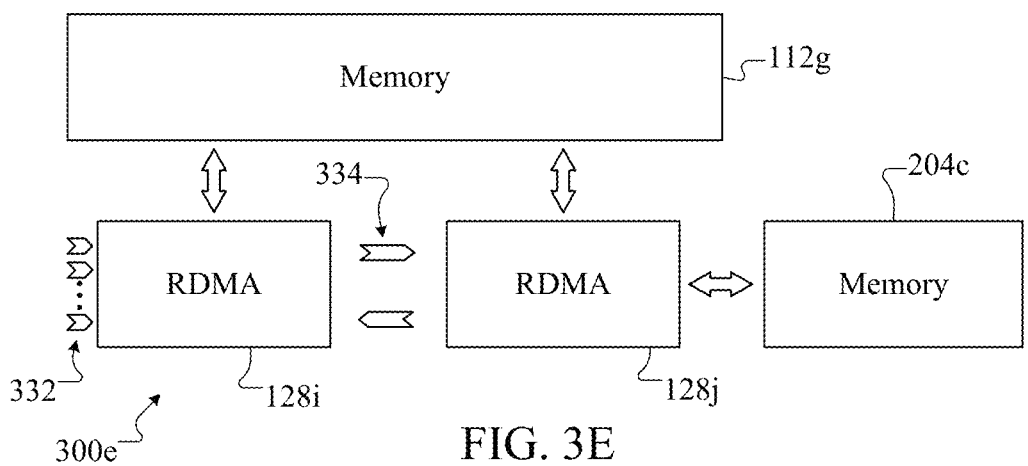

In FIG. 3E, a more complex data mover 300*e* is defined using two RDMA controllers 128*i* and 128*j* that support streaming transfers of information to or from a memory, such as to or from an engine or core memory 204*c*, through another memory, such as through an external memory 112*g*. Here, the RDMA controller 128*i* may support a number of input channels 332 (such as four input channels), which may be used to receive information being streamed into the memory 112*g*. The RDMA controller 128*j* may then support the transfer of information from the memory 112*g* to the memory 204*c*. A buffer may optionally be used to temporarily store the information being streamed into a memory 204*c* or 112*g*. This dual RDMA controller scheme allows one RDMA controller to pull data from a source with particular control, timing, or flow control and allows another RDMA controller to use different control, timing, or flow control to write to destination.

Each RDMA controller 128*i* and 128*j* here may optionally include or support synchronization channels 334, such as when each RDMA controller 128*i* and 128*j* includes a synchronization input port and a synchronization output port. Synchronization read or write operations may then be performed using the synchronization ports. For instance, a synchronization write may send a 32-bit data value or other value to an output port, which is a blocking operation (meaning the write operation stalls if the destination port is not ready to receive the data). A synchronization read operation may read 32 bits or other bit-widths of data from an input port, which is also a blocking operation (meaning the read operation stalls if the source port does not have data available to be read). Here, the synchronization ports can be used as a signaling mechanism between multiple RDMA controllers 128*i*-128*j* connected together in a data transfer chain, such as in the example shown in FIG. 3E. This allows, for example, one RDMA controller 128*i* or 128*j* to inform the other RDMA controller 128*j* or 128*i* if data is available for reading/writing.

Although FIGS. 3A through 3E illustrate examples of types of data movers 300*a*-300*e* that may be automatically designed for a logic device 102, various changes may be made to FIGS. 3A through 3E. For example, other types of data mover components may be used in suitable locations in the data movers 300*a*-300*e*, such as when one or more data transformations 130 (possibly including user-defined HLS logic or other logic) are coupled to one or more RDMA controllers or other components of a data mover. Also, combinations of elements from the various data movers 300*a*-300*e* shown here (or other elements from other data movers) may be used in any suitable combination as needed or desired.

Figure 4:
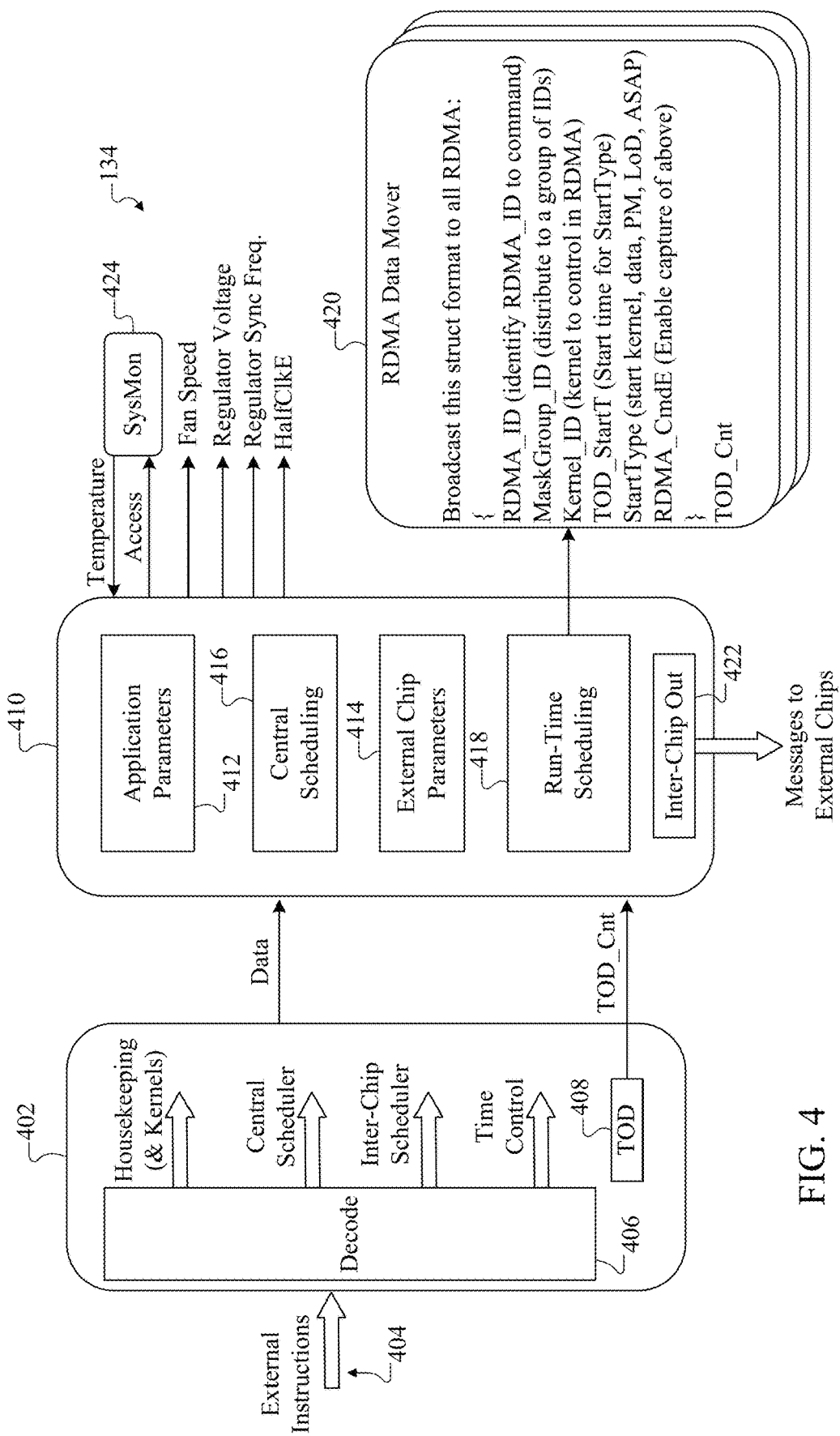
FIG. 4 illustrates an example technique for using behavioral-based data movers for logic devices according to this disclosure.

FIG. 4 illustrates an example technique 400 for using behavioral-based data movers for logic devices according to this disclosure. In particular, FIG. 4 illustrates how the run-time scheduler 134 may be used to trigger usage of behavioral-based data movers in the logic device 102, which may represent any of the logic devices 102*a*-102*d* in the system 100 of FIG. 1. However, the technique 400 may be used with any other suitable data movers and logic devices and in any other suitable system.

As shown in FIG. 4, the run-time scheduler 134 includes an input module 402, which generally receives commands, triggers, or other instructions 404 to be performed by the run-time scheduler 134. The input module 402 here includes a decoder 406, which can decode the instructions 404 and determine the types of operations to be performed by the run-time scheduler 134. In this example, the types of operations may include housekeeping operations (including operations related to application or other kernels), central scheduler operations (scheduling of operations for a logic device 102), inter-chip scheduler operations (scheduling of operations involving other logic devices 102), and time control operations. Note, however, that any other types of instructions 404 may be decoded and performed by the run-time scheduler 134. Also note that the kernel operations here may involve application or other logic kernels to be executed by the engines or cores 104 and any kernels related to other components of the logic device 102 (such as RDMA kernels). The input module 402 also includes a time of day (TOD) function 408, which can output an accurate time that is used for initiating execution of applications or for other purposes. The TOD function 408 can be set, reset, and synchronized across multiple logic devices 102.

The run-time scheduler 134 also includes an execution module 410, which performs various scheduling-related functions of the run-time scheduler 134. In this example, the execution module 410 includes or has access to application parameters 412 and external chip parameters 414. The application parameters 412 relate to characteristics of the applications or other logic to be executed by a logic device 102, and the external chip parameters 414 relate to characteristics of other logic devices 102 (if any). The parameters 412 and 414 may include both (i) parameters identified at compile-time and (ii) parameters identified during run-time.

In some cases, the application parameters 412 and the external chip parameters 414 may include one, some, or all of the following compile-time parameters: a list of application or other logic kernels that may be assigned to engines or cores 104 of a logic device 102, a listing of lower-level kernels that might make up each of at least one higher-level application or other logic, an ordering of kernels at higher levels that call kernels at lower levels, a clock rate to be used with each kernel, an identification of target chips that may operate each application (or kernel), temperature thresholds to be used when a lower clock rate, lower power kernel, changed fan speed, changed voltage regulator voltage, or changed sync frequency is used, each kernel's latency, an identification of whether a kernel is load on demand or run on demand, an identification of other logic devices 102 that can execute each kernel, an over-temperature threshold for a logic device 102, a kernel priority for each kernel, an instruction load time for each kernel, a data load time or partial reconfiguration time for each kernel, and an identification of any kernels that share resources. Note, however, that these parameters are for illustration only and can vary as needed or desired.

Also, in some cases, the application parameters 412 and the external chip parameters 414 may include one, some, or all of the following run-time parameters: a time of day, a countdown to the start of a scheduled loading of instructions for each kernel, a current temperature of the logic device 102, current temperatures of other logic devices 102, a start time for execution of each kernel, an end time by which each kernel should complete execution, a scheduled start time for execution of each kernel at the logic device 102, a possible start time that another logic device 102 could start execution of each kernel, and an indication of whether a power saving mode is being used. Note, however, that these parameters are for illustration only and can vary as needed or desired.

This information (and possibly other information) can be used by a central scheduling function 416 and a run-time scheduling function 418. The central scheduling function 416 can be responsible for scheduling the overall applications or other logic to be executed by the logic device 102 and for providing a general schedule for execution. The run-time scheduling function 418 can be responsible for scheduling execution of specific kernels by specific hardware, such as when the run-time scheduling function 418 schedules execution of various application or other logic kernels by specific ones of the engines or cores 104.

As part of the run-time scheduling, the function 418 may broadcast or otherwise transmit one or more RDMA data mover definitions 420, which can be used to configure the RDMA controllers 128 for use during execution of the applications or other logic. In this example, each RDMA data mover definition 420 identifies a specific RDMA controller 128, a mask for a group of RDMA controllers 128, a kernel identifier for a kernel to be used with the RDMA controller 128, and a time of day at which the RDMA controller 128 will be used. Each RDMA data mover definition 420 also identifies whether the RDMA controller 128 will be used when starting execution of a kernel, to load data for a kernel, to program a memory (PM) for a kernel, to load a kernel on demand (LoD), or to execute a kernel as soon as possible (ASAP). In addition, each RDMA data mover definition 420 includes a flag to indicate whether the RDMA controller 128 should capture this information and a current time of day. This information allows an RDMA controller 128 to be configured for use with execution of a particular application or other logic and allows simultaneous start times throughout the logic device 102 (through local comparisons of commanded start times with the provided current time of day).

An inter-chip output 422 facilitates communication with other logic devices 102. For example, the inter-chip output 422 may allow RDMA data mover definitions 420 or other information to be sent to other logic devices 102. A system monitor 424 may also be used to provide information like temperature measurements of the logic device 102 to the execution module 410 for consideration by the run-time scheduling function 418. In addition, along with scheduling tasks, the execution module 410 can be used to adjust the speed of the fan 146, adjust the voltage or sync frequency of the voltage regulator 148, or adjust the frequency of the clock 140.

Although FIG. 4 illustrates one example of a technique 400 for using behavioral-based data movers for logic devices 102, various changes may be made to FIG. 4. For example, various components in FIG. 4 may be combined, further subdivided, replicated, omitted, or rearranged and additional components may be added according to particular needs. Also, data movers designed in accordance with this disclosure may be used in any other suitable manner, including uses without a run-time scheduler 134 and uses without RDMA data mover definitions 420.

Figure 5:
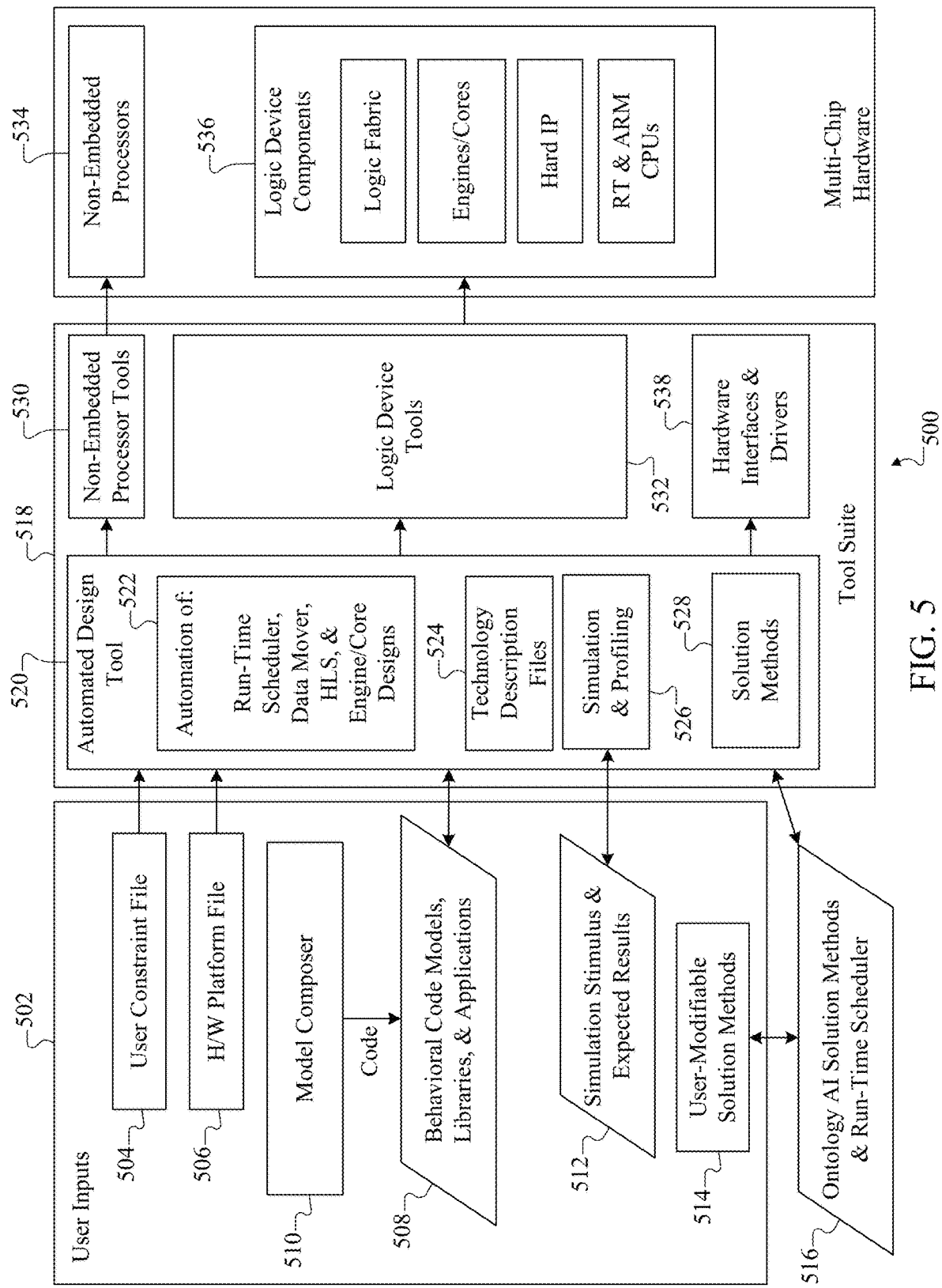
FIG. 5 illustrates an example architecture supporting automated design of behavioral-based data movers for logic devices according to this disclosure.

FIG. 5 illustrates an example architecture 500 supporting automated design of behavioral-based data movers for logic devices according to this disclosure. The architecture 500 may, for example, be used to generate one or more of the data movement components 108 for use by one or more logic devices 102, 102a-102d. In particular, the architecture 500 may represent one specific example implementation of the automated tool suite 214 from FIG. 2.

As shown in FIG. 5, the architecture 500 obtains a number of user inputs 502. In this example, the user inputs 502 include at least one user constraint file 504 and at least one hardware platform file 506. The user constraint file 504 can identify various user-defined constraints to be placed on a logic device 102 generally or on one or more data movers specifically, such as the maximum temperature threshold allowable for engines or cores 104 of a logic device 102 or for the logic device 102 itself. In some cases, the user constraint file 504 may include the constraints 218 described above. The hardware platform file 506 can identify various parameters of the logic device 102 or board characteristics to be used with the run-time scheduler 134, such as the number of engines or cores 104 and latencies associated with components and interfaces of the logic device 102. In some cases, the hardware platform file 506 may include the hardware model 220 described above.

The user inputs 502 may also include behavioral source models, libraries, and applications 508, which can define the actual logic to be executed by the engines or cores 104 of the logic device 102 during use. This can include, for example, the radar functionality to be executed in a radar application or other functionality to be executed in other applications. In some cases, at least some of the behavioral source models, libraries, and applications 508 may be manually created by a user. In other cases, a model composer 510 may receive inputs from a user defining a behavioral source code model to be implemented, and the model composer 510 may automatically generate at least part of the behavioral source models, libraries, and applications 508. The model composer 510 may, for instance, represent a MATLAB, SIMULINK, or XILINX tool for converting source code models into actual source code. In some cases, the behavioral source models, libraries, and applications 508 may include the behavioral source code 216 described above.

The user inputs 502 may further include simulation information 512 and user-modifiable solution method information 514. The simulation information 512 may include stimuli for simulations to be performed using a logic device design and expected results associated with the stimuli. The user-modifiable solution method information 514 represents an automation tool-provided list of methods that can be employed by the automation tool to solve a user's requirements for latency, resources, power, and timing closure. This may or may not include user inputs regarding the potential design(s) for the data mover(s). An additional input here represents ontology-based information 516, which can include AI-based information regarding the potential design for the logic device 102 generally and/or for the data mover(s) specifically. The ontology-based information 516 may include or represent information associated with an ML/AI-based deep knowledge expert system, which can be used to capture and use information for mapping user applications to logic device designs while satisfying user constraints.

A tool suite 518 (which may represent the automated tool suite 214 described above) receives the various inputs and processes the information to automatically create a possible design for a logic device 102 (including a design for one or more data movement components 108). The tool suite 518 can thereby help to reduce defects and improve design times for FPGAs or other types of logic devices 102. The tool suite 518 represents any suitable software automation tool for designing logic devices.

In this example, the tool suite 518 includes an automated design tool 520, which can be used to support various functions for automating the design of specific components of the logic device 102. This functionality includes a design function 522 for automating run-time scheduler, data mover, HLS, and engine/core designs of a logic device 102. This functionality also supports the use of one or more technology description files 524, which can describe the logic device 102 being designed (which has the benefit of minimizing modifications required for the automated design tool 520 for each new target technology). This functionality further includes a simulation and profiling function 526, which can simulate the operation of the designed logic device 102 and compare the simulated results with expected results or debug or profile the simulated results. In addition, this functionality supports the consideration of various solution methods 528, including those defined in the user-modifiable solution method information 514 and ontology-based solution methods identified by the automation tool. The automated design tool 520 represents any suitable software tool for designing various aspects of logic devices, such as the VISUAL SYSTEM INTEGRATOR (VSI) software tool from SYSTEM VIEW, INC. (as modified to support the design of the data movers in accordance with this disclosure).

At least some of the outputs from the automated design tool 520 may be processed by one or more additional tools 530, 532. For example, the tool 530 may be used to convert any suitable aspects of the design of a logic device 102 (as determined by the automated design tool 520) into compiled code or other logic that may be executed by one or more non-embedded processors 534 associated with the hardware platform file 506. The tool 532 may be used to convert any suitable aspects of the design of the logic device 102 (as determined by the automated design tool 520) into compiled code, chip build (such as an FPGA configuration file), or other logic that may be executed by one or more components 536 of the logic device 102, such as code that can be used with a fabric (interface 106), engines/cores 104, hard intellectual property (IP) modules, or embedded processing devices 132 of the logic device 102. The tool(s) 530, 532 that are used here can vary depending on the logic device 102 ultimately being designed. For instance, the tools 532 may include FPGA company-specific tools, such as the XILINX VIVADO tool, the XILINX VITIS tool, or a XILINX AIE or network-on-a-chip (NoC) compiler. In addition, the outputs from the automated design tool 520 may include a definition of one or more hardware interface and one or more drivers 538 that can be used to interact with the logic device 102 as designed.

Although FIG. 5 illustrates one example of an architecture 500 supporting automated design of behavioral-based data movers for logic devices 102, various changes may be made to FIG. 5. For example, various components in FIG. 5 may be combined, further subdivided, replicated, omitted, or rearranged and additional components may be added according to particular needs. Also, the actual technique for designing one or more data movers for a logic device 102 can easily vary based on, among other things, the specific logic device 102 for which the one or more data movers are being designed. In addition, one or more data movers for a logic device 102 may be designed using any other suitable automation tool. As a result, while the designing of one or more data movers is described above as being part of a larger collection of tools or other applications/logic that support partial- or fully-automated designing of logic devices, the approaches for designing one or more data movers described in this patent document may be used individually or with any other suitable collection of tools or other applications/logic that support partial- or fully-automated designing of logic devices.

Figure 6:
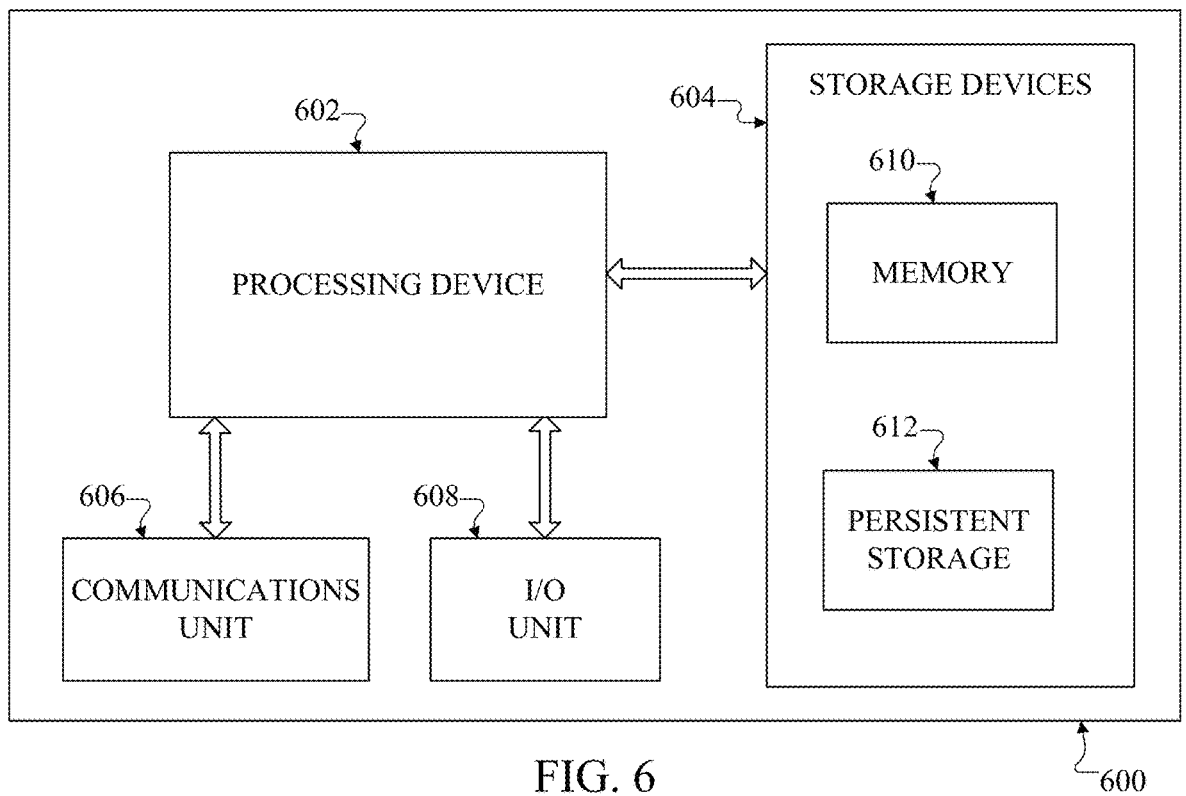
FIG. 6 illustrates an example computing device or system supporting automated design of behavioral-based data movers for logic devices according to this disclosure.

FIG. 6 illustrates an example computing device or system 600 supporting automated design of behavioral-based data movers for logic devices according to this disclosure. The computing device or system 600 may, for example, be used to implement the architecture 500 shown in FIG. 5 and described above. Thus, the computing device or system 600 may be used to implement one or more functions of or related to the development or deployment of one or more data movers.

As shown in FIG. 6, the computing device or system 600 may include at least one processing device 602, at least one optional storage device 604, at least one communications unit 606, and at least one optional input/output (I/O) unit 608. The processing device 602 may execute instructions that can be loaded into a memory 610 or other location that is local to the processing device 602. The processing device 602 includes any suitable number(s) and type(s) of processors or other processing devices in any suitable arrangement. Example types of processing devices 602 include one or more microprocessors, microcontrollers, digital signal processors (DSPs), ASICs, FPGAs, or discrete circuitry.

The memory 610 and a persistent storage 612 are examples of storage devices 604, which represent any structure(s) capable of storing and facilitating retrieval of information (such as data, program code, and/or other suitable information on a temporary or permanent basis). The memory 610 may represent a random access memory or any other suitable volatile or non-volatile storage device(s). The persistent storage 612 may contain one or more components or devices supporting longer-term storage of data, such as a read only memory, hard drive, Flash memory, or optical disc.

The communications unit 606 supports communications with other systems or devices. The communications unit 606 may support communications through any suitable physical or wireless communication link(s), such as a network or dedicated connection(s).

The I/O unit 608 allows for input and output of data. For example, the I/O unit 608 may provide a connection for user input through a keyboard, mouse, keypad, touchscreen, or other suitable input device. The I/O unit 608 may also send output to a display or other suitable output device. Note, however, that the I/O unit 608 may be omitted if the device or system 600 does not require local I/O, such as when the device or system 600 represents a server or other component that can be accessed remotely over a network.

Although FIG. 6 illustrates one example of a computing device or system 600 supporting automated design of behavioral-based data movers for logic devices 102, various changes may be made to FIG. 6. For example, computing devices and systems come in a wide variety of configurations, and FIG. 6 does not limit the automated design of one or more data movers to any particular computing device or system.

Figure 7:
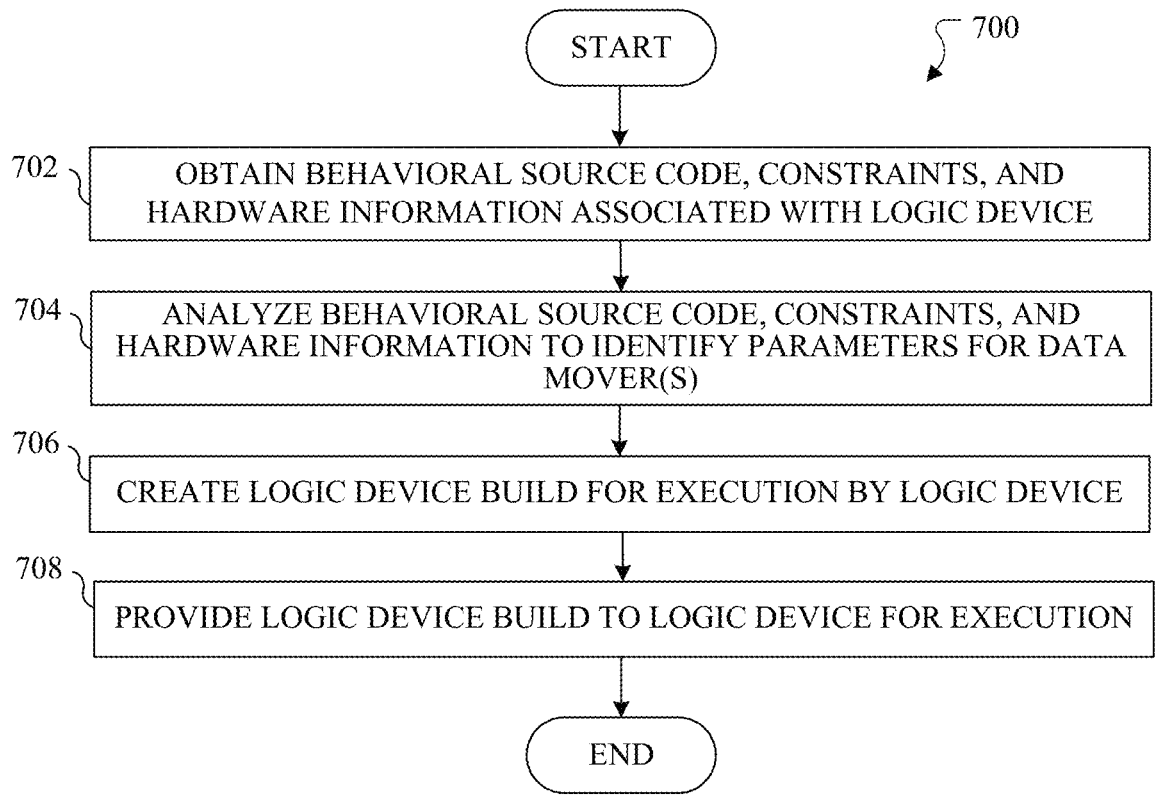
FIG. 7 illustrates an example method for automated design of behavioral-based data movers for logic devices according to this disclosure.

FIG. 7 illustrates an example method 700 for automated design of behavioral-based data movers for logic devices according to this disclosure. For ease of explanation, the method 700 is described as involving the design of one or more data movement components 108 in the logic device 102 of FIG. 2 within the system 100 of FIG. 1. However, the method 700 may involve the use of any other suitable data movement components and logic devices in any other suitable system.

As shown in FIG. 7, behavioral source code, constraints, and hardware information associated with a logic device being designed are obtained at step 702. This may include, for example, receiving the behavioral source code 216, constraints 218, and a hardware model 220 as inputs to the automated tool suite 214. As a particular example, this may include receiving the user constraint file 504, hardware platform file 506, and behavioral source models, libraries, and applications 508 (which may or may not be produced by a model composer 510) as inputs to the tool suite 518.

The behavioral source code, hardware information, and constraints are analyzed to identify one or more data movers associated with execution of the behavioral source code at step 704. This may include, for example, the automated tool suite 214 or the tool suite 518 using the behavioral source code to identify data to be provided as inputs and data to be provided as outputs during execution of the behavioral source code. This may also include the automated tool suite 214 or the tool suite 518 using these inputs to identify the hardware that is available for use in moving data, such as by identifying the available external interfaces for a logic device 102. This may further include the automated tool suite 214 or the tool suite 518 using these inputs to identify (i) logic to be inserted into at least one data mover and (ii) an identification of one or more interfaces of the logic device 102 to be used by the at least one data mover.

A build or code for execution by a logic device is created at step 706. This may include, for example, the automated tool suite 214 or the tool suite 518 creating an FPGA build or other code to be executed by one or more data movement components 108 in order to support the identified data movements and thereby support execution of the behavioral source code. The created build or code may, for instance, include code in a higher-level RDMA language that can be compiled to produce executable code for one or more RDMA controllers 128. The created build or code may also define how one or more buffers 126 are used and may define one or more data transformations 130 to be applied to information. The build or code is provided to the logic device for execution at step 708. This may include, for example, the automated tool suite 214 or the tool suite 518 using one or more tools 530, 532 to convert the logic device design into actual executable code or an FPGA configuration file build for one or more logic devices 102.

Although FIG. 7 illustrates one example of a method 700 for automated design of behavioral-based data movers for logic devices 102, various changes may be made to FIG. 7. For example, while shown as a series of steps, various steps in FIG. 7 may overlap, occur in parallel, occur in a different order, or occur any number of times.

Figure 8:
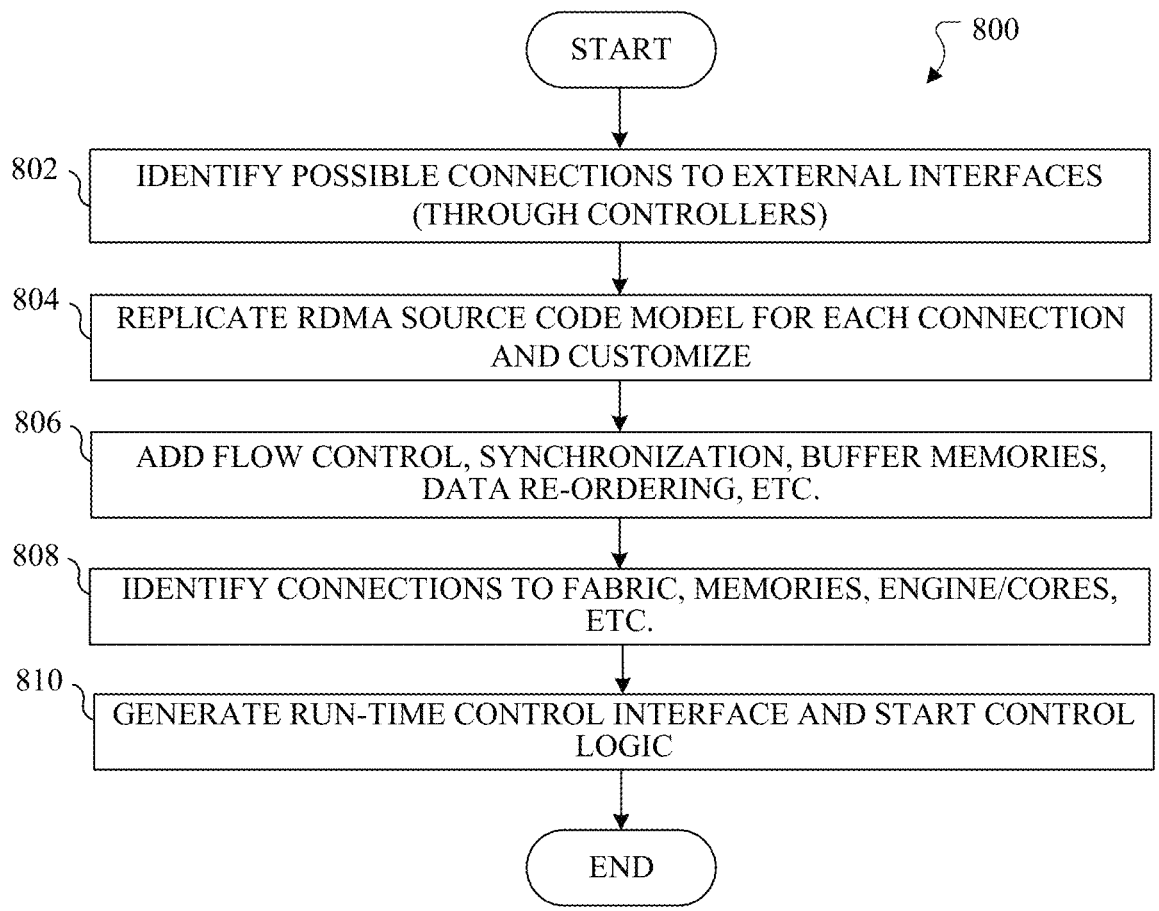
FIG. 8 illustrates an example method for designing aspects of behavioral-based data movers for logic devices according to this disclosure.

FIG. 8 illustrates an example method 800 for designing aspects of behavioral-based data movers for logic devices according to this disclosure. The method 800 may, for example, be performed during the method 700 as part of the process for analyzing inputs and generating code for execution by a logic device 102. For ease of explanation, the method 800 is described as involving the design of one or more data movement components 108 in the logic device 102 of FIG. 2 within the system 100 of FIG. 1. However, the method 800 may involve the use of any other suitable data movement components and logic devices in any other suitable system.

As shown in FIG. 8, possible connections of a logic device to external interfaces (through suitable controllers) are identified at step 802. This may include, for example, the automated tool suite 214 or the tool suite 518 using the hardware information (such as the hardware model 220 or hardware platform file 506) or other inputs to identify the types of external interfaces of a logic device 102 (such as memory, PCI-e, and Ethernet interfaces) and controllers associated with those external interfaces. For each identified connection, an RDMA source model may be replicated for that connection and customized at step 804. Here, the RDMA source model may generally represent higher-level RDMA language source code or other code for defining an RDMA controller 128. This may include, for example, the automated tool suite 214 or the tool suite 518 customizing the RDMA source model for each external interface based on that specific external interface. The customization may, for instance, be based on constraints identifying how a specific external interface may be accessed and how memory locations may be addressed.

Any desired features such as flow control, synchronization, and data re-ordering can be added for each external interface at step 806. This may include, for example, the automated tool suite 214 or the tool suite 518 using its inputs to identify any buffers 126 that may be needed, such as based on the amounts of data to be transported within or through the logic device 102 during execution of behavioral source code. This may also include the automated tool suite 214 or the tool suite 518 using its inputs to determine whether incoming or outgoing information used or produced by the behavioral source code will need to be re-ordered, such as based on how the information is received or provided to an external device and how the information is expected by one or more engines or cores 104. This may further include the automated tool suite 214 or the tool suite 518 using its inputs to determine how to control the flow of information through an external interface and whether multiple components (such as multiple RDMA controllers 128) require synchronization control.

Connections to fabric, memory, engine/core, or other resources of a logic device are identified at step 808. This may include, for example, the automated tool suite 214 or the tool suite 518 identifying the specific connections to be used to provide information to one or more engines or cores 104 or other components of the logic device 102 from one or more buffers 126, RDMA controllers 128, data transformations 130, or other data movement components 108 (or vice versa). Example types of connections are described above with reference to FIGS. 3A through 3E.

Run-time control interface and start control logic is generated at step 810. This may include, for example, the automated tool suite 214 or the tool suite 518 generating (for each external interface connection based on the information previously identified) logic defining how information will be transferred between the external interface and one or more engines or cores 104 during execution of the behavioral source code. In some cases, this logic can be based on how the behavioral source code will likely be retrieving or providing information through the external interface during execution. This may also include the automated tool suite 214 or the tool suite 518 generating (for each external interface connection based on the information previously identified) logic defining how control signals can be sent to various components (such as an external interface controller, one or more engines or cores 104, and one or more data movement components 108) in order to synchronize the components and enable transport of information between the components.

Although FIG. 8 illustrates one example of a method 800 for designing aspects of behavioral-based data movers for logic devices 102, various changes may be made to FIG. 8. For example, while shown as a series of steps, various steps in FIG. 8 may overlap, occur in parallel, occur in a different order, or occur any number of times.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software or hardware components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:

obtaining behavioral source code defining logic to be performed using at least one logic device and constraints identifying permitted characteristics of data movements associated with execution of the logic, the at least one logic device containing multiple components that support at least one of: internal data movements within the at least one logic device and external data movements external to the at least one logic device as defined by the behavioral source code and the constraints, the constraints identifying the permitted characteristics of at least one of: the internal data movements and the external data movements, wherein the logic of the behavioral source code comprises a plurality of logic elements each of which is movable to and executable by the at least one logic device, wherein the logic elements comprise instructions and data;

using the constraints to identify data movement logic to be inserted into at least one of one or more data movers for execution by the at least one of the one or more data movers and to identify one or more interfaces of the at least one logic device to be used by the one or more data movers; and using the constraints and the behavioral source code to automatically design the one or more data movers for use by a run-time scheduler within the at least one logic device, the one or more data movers configured to perform at least one of the internal and external data movements in accordance with the permitted characteristics;

wherein the one or more data movers are optimized to provide a needed latency of the logic of the behavioral source code when performed by the at least one logic device.

2. The method of claim 1, wherein the one or more data movers comprise at least one of:

one or more remote direct memory access (RDMA) controllers in the at least one logic device, each RDMA controller associated with an internal or external interface of the at least one logic device;

one or more engines or cores in the at least one logic device; and one or more buffers in the at least one logic device, each buffer configured to temporarily store information transported between one of the one or more engines or cores and one of the one or more RDMA controllers.

3. The method of claim 2, wherein the one or more data movers further comprise one or more data transformations in the at least one logic device.

4. The method of claim 2, wherein the one or more RDMA controllers include a memory control function and a sequence random access memory (RAM).

5. The method of claim 1, wherein the one or more interfaces comprise at least one of:
an external memory interface;
a peripheral component interconnect express (PCI-e) interface;
an Ethernet interface; and
an interface to another logic device.

6. The method of claim 1, wherein using the constraints and the behavioral source code to automatically design the one or more data movers comprises:
identifying at least one of: a remote direct memory access (RDMA) controller for each of the internal and external data movements and at least one buffer associated with at least one of the RDMA controllers;
identifying flow control, synchronization, or data re-ordering logic for at least one of the one or more data movers; and
identifying source and destination connections to or from the RDMA controllers.

7. The method of claim 1, wherein the at least one logic device comprises at least one of: a field programmable gate array (FPGA), an adaptive compute accelerator platform (ACAP), an application-specific integrated circuit (ASIC), a very-large-scale integration (VSLI) chip, a memory chip, a data converter, a central processing unit (CPU), and an accelerator chip.

8. An apparatus comprising:
at least one processor configured to:
obtain behavioral source code defining logic to be performed using at least one logic device and constraints identifying permitted characteristics of data movements associated with execution of the logic, the at least one logic device containing multiple components that support at least one of: internal data movements within the at least one logic device and external data movements external to the at least one logic device as defined by the behavioral source code and the constraints, the constraints identifying the permitted characteristics of at least one of: the internal data movements and the external data movements, wherein the logic of the behavioral source code comprises a plurality of logic elements each of which is movable to and executable by the at least one logic device, wherein the logic elements comprise instructions and data;
use the constraints to identify data movement logic to be inserted into at least one of one or more data movers for execution by the at least one of the one or more data movers and to identify one or more interfaces of the at least one logic device to be used by the one or more data movers;
use the constraints and the behavioral source code to automatically generate a design of the one or more data movers for use by a run-time scheduler within the at least one logic device, the one or more data movers configured to perform at least one of the internal and external data movements in accordance with the permitted characteristics; and
configure the at least one logic device based on the design;
wherein the one or more data movers are optimized to provide a needed latency of the logic of the behavioral source code when performed by the at least one logic device.

9. The apparatus of claim 8, wherein the design of the one or more data movers comprises a design of at least one of:
one or more remote direct memory access (RDMA) controllers in the at least one logic device, each RDMA controller associated with an internal or external interface of the at least one logic device;
one or more engines or cores in the at least one logic device; and
one or more buffers in the at least one logic device, each buffer configured to temporarily store information transported between one of the one or more engines or cores and one of the one or more RDMA controllers.

10. The apparatus of claim 9, wherein the design of the one or more data movers further comprises a design of one or more data transformations in the at least one logic device.

11. The apparatus of claim 9, wherein the one or more RDMA controllers include a memory control function and a sequence random access memory (RAM).

12. The apparatus of claim 8, wherein the one or more interfaces comprise at least one of:
an external memory interface;
a peripheral component interconnect express (PCI-e) interface;
an Ethernet interface; and
an interface to another logic device.

13. The apparatus of claim 8, wherein, to use the constraints and the behavioral source code to automatically generate the design, the at least one processor is configured to:
identify at least one of: a remote direct memory access (RDMA) controller for each of the internal and external data movements and at least one buffer associated with at least one of the RDMA controllers;
identify flow control, synchronization, or data re-ordering logic for at least one of the one or more data movers; and
identify source and destination connections to or from the RDMA controllers.

14. The apparatus of claim 8, wherein the at least one logic device comprises at least one of: a field programmable gate array (FPGA), an adaptive compute accelerator platform (ACAP), an application-specific integrated circuit (ASIC), a very-large-scale integration (VSLI) chip, a memory chip, a data converter, a central processing unit (CPU), and an accelerator chip.

15. A non-transitory computer readable medium containing instructions that when executed cause at least one processor to:
obtain behavioral source code defining logic to be performed using at least one logic device and constraints identifying permitted characteristics of data movements associated with execution of the logic, the at least one logic device containing multiple components that support at least one of: internal data movements within the at least one logic device and external data movements external to the at least one logic device as defined by the behavioral source code and the constraints, the constraints identifying the permitted characteristics of at least one of: the internal data movements and the external data movements, wherein the logic of the behavioral source code comprises a plurality of logic elements each of which is movable to and executable by the at least one logic device, wherein the logic elements comprise instructions and data;

use the constraints to identify data movement logic to be inserted into at least one of one or more data movers for execution by the at least one of the one or more data movers and to identify one or more interfaces of the at least one logic device to be used by the one or more data movers; and use the constraints and the behavioral source code to automatically generate a design of the one or more data movers for use by a run-time scheduler within the at least one logic device, the one or more data movers configured to perform at least one of the internal and external data movements in accordance with the permitted characteristics;

wherein the one or more data movers are optimized to provide a needed latency of the logic of the behavioral source code when performed by the at least one logic device.

16. The non-transitory computer readable medium of claim 15, wherein the design of the one or more data movers comprises a design of at least one of:

one or more remote direct memory access (RDMA) controllers in the at least one logic device, each RDMA controller associated with an internal or external interface of the at least one logic device;

one or more engines or cores in the at least one logic device; and one or more buffers in the at least one logic device, each buffer configured to temporarily store information transported between one of the one or more engines or cores and one of the one or more RDMA controllers.

17. The non-transitory computer readable medium of claim 16, wherein the design of the one or more data movers further comprises a design of one or more data transformations in the at least one logic device.

18. The non-transitory computer readable medium of claim 16, wherein the one or more RDMA controllers include a memory control function and a sequence random access memory (RAM).

19. The non-transitory computer readable medium of claim 15, wherein the one or more interfaces comprise at least one of:

an external memory interface;

a peripheral component interconnect express (PCI-e) interface;

an Ethernet interface; and an interface to another logic device.

20. The non-transitory computer readable medium of claim 15, wherein the instructions that cause the at least one processor to use the constraints and the behavioral source code to automatically generate the design comprise instructions cause the at least one processor to:

identify at least one of: a remote direct memory access (RDMA) controller for each of the internal and external data movements and at least one buffer associated with at least one of the RDMA controllers;

identify flow control, synchronization, or data re-ordering logic for at least one of the one or more data movers; and identify source and destination connections to or from the RDMA controllers.

\* \* \* \* \*